(12) United States Patent
Kim

(10) Patent No.: US 12,349,562 B2
(45) Date of Patent: Jul. 1, 2025

(54) DISPLAY DEVICE

(71) Applicant: Samsung Display Co., LTD., Yongin-si (KR)

(72) Inventor: Yeon Kyung Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 679 days.

(21) Appl. No.: 17/547,979

(22) Filed: Dec. 10, 2021

(65) Prior Publication Data

US 2022/0208936 A1 Jun. 30, 2022

(30) Foreign Application Priority Data

Dec. 30, 2020 (KR) .......................... 10-2020-0188570

(51) Int. Cl.
*H01L 27/32* (2006.01)
*H10K 59/122* (2023.01)
*H10K 59/126* (2023.01)
*H10K 59/131* (2023.01)
*H10K 59/35* (2023.01)

(52) U.S. Cl.
CPC ......... *H10K 59/131* (2023.02); *H10K 59/122* (2023.02); *H10K 59/126* (2023.02); *H10K 59/353* (2023.02)

(58) Field of Classification Search
CPC .. H10K 59/131; H10K 59/122; H10K 59/126; H10K 59/353; H01L 25/167; H01L 33/62; H01L 33/20; H01L 25/0753; H01L 27/1214; G09G 3/32
See application file for complete search history.

(56) References Cited

U.S. PATENT DOCUMENTS

| 7,095,471 B2 | 8/2006 | Wu |
| 2008/0252203 A1 | 10/2008 | Lee |
| 2017/0176797 A1 | 6/2017 | Kim et al. |

(Continued)

FOREIGN PATENT DOCUMENTS

| EP | 3 355 356 A2 | 8/2018 |
| KR | 2017-0073482 A | 6/2017 |

(Continued)

OTHER PUBLICATIONS

International Search Report dated Apr. 7, 2022 for corresponding Korean Application No. PCT/KR2021/019818 (3 pages).

(Continued)

*Primary Examiner* — Mohammed R Alam
(74) *Attorney, Agent, or Firm* — Womble Bond Dickinson (US) LLP

(57) ABSTRACT

A display device includes a pixel including a plurality of sub-pixels, each of the sub-pixels including a first electrode extending in a first direction, a second electrode spaced from the first electrode in a second direction, and a plurality of light emitting elements on the first electrode and the second electrode, and a plurality of first scan lines on the pixel and extending in the first direction, wherein the plurality of sub-pixels includes a first sub-pixel on which a portion of the first scan line is located, and a second sub-pixel adjacent to the first sub-pixel in the second direction, and the first scan line does not overlap the first electrode disposed on the first sub-pixel.

19 Claims, 22 Drawing Sheets

(56) References Cited

U.S. PATENT DOCUMENTS

2018/0190672 A1* 7/2018 Lee .................. H01L 27/156
2020/0273397 A1 8/2020 Jeong et al.
2021/0126082 A1* 4/2021 Yoon ................ H10K 59/1213

FOREIGN PATENT DOCUMENTS

| KR | 2020-0088951 A | 7/2020 |
| KR | 2020-0138479 A | 12/2020 |
| KR | 10-2021-0107208 A | 9/2021 |

OTHER PUBLICATIONS

Written Opinion dated Apr. 7, 2022 for corresponding Korean Application No. PCT/KR2021/019818 (3 pages).

* cited by examiner

DISPLAY DEVICE

CROSS-REFERENCE TO RELATED APPLICATION

This application claims priority to and the benefit of Korean Patent Application No. 10-2020-0188570 filed on Dec. 30, 2020 in the Korean Intellectual Property Office, the entire content of which is incorporated by reference herein.

BACKGROUND

1. Field

The disclosure relates to a display device.

2. Description of the Related Art

The importance of display devices has steadily increased with the development of multimedia technology. In response thereto, various types of display devices such as an organic light emitting display (OLED), a liquid crystal display (LCD) and the like have been used.

A display device is a device for displaying an image, and includes a display panel, such as an organic light emitting display panel or a liquid crystal display panel. The light emitting display panel may include light emitting elements, e.g., light emitting diodes (LED), and examples of the light emitting diode include an organic light emitting diode using an organic material as a light emitting material and an inorganic light emitting diode using an inorganic material as a light emitting material.

SUMMARY

Aspects of embodiments of the present disclosure provide a display device capable of preventing or reducing luminance non-uniformity that may occur in some pixels due to interference between a lower wire and an upper electrode.

However, aspects of embodiments of the present disclosure are not limited to those set forth herein. The above and other aspects of embodiments of the present disclosure will become more apparent to one of ordinary skill in the art to which the disclosure pertains by referencing the detailed description of the disclosure given below.

The display device according to one embodiment may have a structure in which parasitic capacitance is prevented or substantially prevented from being formed between an electrode of each pixel and a lower scan line. Accordingly, in one embodiment, the display device may prevent or may substantially prevent luminance non-uniformity from occurring due to the parasitic capacitance according to the position of the display area.

It should be noted that the aspects and features of embodiments of the present disclosure are not limited to the one described above, and other aspects and features of embodiments of the present disclosure will be apparent from the following description.

According to an embodiment of the disclosure, a display device includes a pixel including a plurality of sub-pixels, each of the sub-pixels including a first electrode extending in a first direction, a second electrode spaced from the first electrode in a second direction, and a plurality of light emitting elements on the first electrode and the second electrode, and a plurality of first scan lines on the pixel and extending in the first direction, wherein the plurality of sub-pixels includes a first sub-pixel on which a portion of the first scan line is disposed, and a second sub-pixel adjacent to the first sub-pixel in the second direction, and the first scan line does not overlap the first electrode at the first sub-pixel.

The display device may further include a second scan line spaced from the first scan line in the second direction, wherein the second scan line partially overlaps the second electrode, and wherein the second scan line does not overlap the first electrode.

The display device may further include a bank including portions extending in the first direction and the second direction to surround a region in which the light emitting elements are located, wherein the first scan line overlaps a portion of the bank extending in the first direction.

The display device may further include a first voltage wire spaced from the second scan line in the second direction and overlapping the first electrode, a second voltage wire spaced from the first voltage wire in the second direction, and a plurality of data lines located between the first voltage wire and the second voltage wire.

The pixel may further include a third sub-pixel adjacent to the second sub-pixel in the second direction and including a first electrode, a second electrode, and light emitting elements, where the second voltage wire may be located in the third sub-pixel, and the data lines may be located between the second sub-pixel and the third sub-pixel.

The display device may further include a first gate pattern on the first scan line and connected to the first scan line, and a second gate pattern on the second scan line and connected to the second scan line, wherein each of the first gate pattern and the second gate pattern may do not overlap the first electrode.

The display device may further include a first conductive pattern on the first gate pattern and connected to the first scan line, and a second conductive pattern on the second gate pattern and connected to the second scan line, wherein each of the first conductive pattern and the second conductive pattern may do not overlap the first electrode.

The display device may further include a second scan line spaced from the first scan line in the second direction and overlapping the first electrode, and a shielding layer disposed on the second scan line and overlapping the first electrode and the second scan line.

The display device may further include a first voltage wire spaced from the second scan line in the second direction and overlapping the first electrode, and a second voltage wire spaced from the second scan line in the second direction with the first voltage wire interposed therebetween, wherein the shielding layer may overlap the second voltage wire, the first scan line, and the second scan line, and is electrically connected to the second voltage wire.

The second voltage wire may be electrically connected to the second electrode.

The display device may further include a first gate pattern on the first scan line and connected to the first scan line, and a second gate pattern on the second scan line and connected to the second scan line, wherein the second gate pattern may overlap the first electrode, and the shielding layer may overlap the first gate pattern and the second gate pattern.

The display device may further include a third scan line extending in the second direction and connected to the first scan line or the second scan line.

The third scan line may be in contact with the first scan line or the second scan line through a contact hole at a portion crossing the first scan line or the second scan line, and wherein the display device includes a plurality of pixels including the pixel, the plurality of pixels including a first type pixel in which the contact hole is disposed, and a second type pixel in which the contact hole is not disposed.

At least one of the plurality of pixels arranged along the second direction on a same row may be the first type pixel, and remaining pixels are the second type pixels.

According to an embodiment of the disclosure, a display device includes a substrate, a first conductive layer on the substrate and including a first scan line and a second scan line, and a first voltage wire and a second voltage wire, a buffer layer on the first conductive layer, a semiconductor layer including a plurality of first active layers on the buffer layer, a first gate insulating layer on the semiconductor layer, a second conductive layer including a first gate pattern and a second gate pattern located on the first gate insulating layer, the first gate pattern overlapping the first scan line, the second gate pattern overlapping the second scan line, and a first gate electrode overlapping the first active layer, a first interlayer insulating layer on the second conductive layer, a third conductive layer on the first interlayer insulating layer and including a first source electrode and a first drain electrode connected to the first active layer, a via layer on the third conductive layer, a first electrode on the via layer and electrically connected to the first voltage wire, and a second electrode spaced from the first electrode on the via layer and electrically connected to the second voltage wire, and a light emitting element on the first electrode and the second electrode, wherein the first electrode does not to overlap the first scan line in a thickness direction of the display device.

The first electrode may overlap the first voltage wire in the thickness direction of the display device and does not overlap the second scan line in the thickness direction of the display device, and the second electrode partially may overlap the second scan line.

The third conductive layer may further include a conductive pattern directly connected to the first voltage wire and overlapping the first electrode in the thickness direction of the display device.

The first electrode may overlap the second scan line in the thickness direction of the display device, where the second voltage wire may be spaced from the second scan line in a second direction with the first scan line interposed therebetween, and the display device may further include a shielding layer on the first interlayer insulating layer and overlapping the first scan line, the second scan line, and the first electrode in the thickness direction of the display device.

The shielding layer may be directly connected to the second voltage wire through a contact hole penetrating the first interlayer insulating layer, the first gate insulating layer, and the buffer layer at a portion overlapping the second voltage wire.

The display device may further include a second interlayer insulating layer on the third conductive layer, wherein the shielding layer may be on the second interlayer insulating layer.

BRIEF DESCRIPTION OF THE DRAWINGS

The above and other aspects and features of embodiments of the present disclosure will become more apparent by describing in detail embodiments thereof with reference to the attached drawings, in which.

Figure 4:
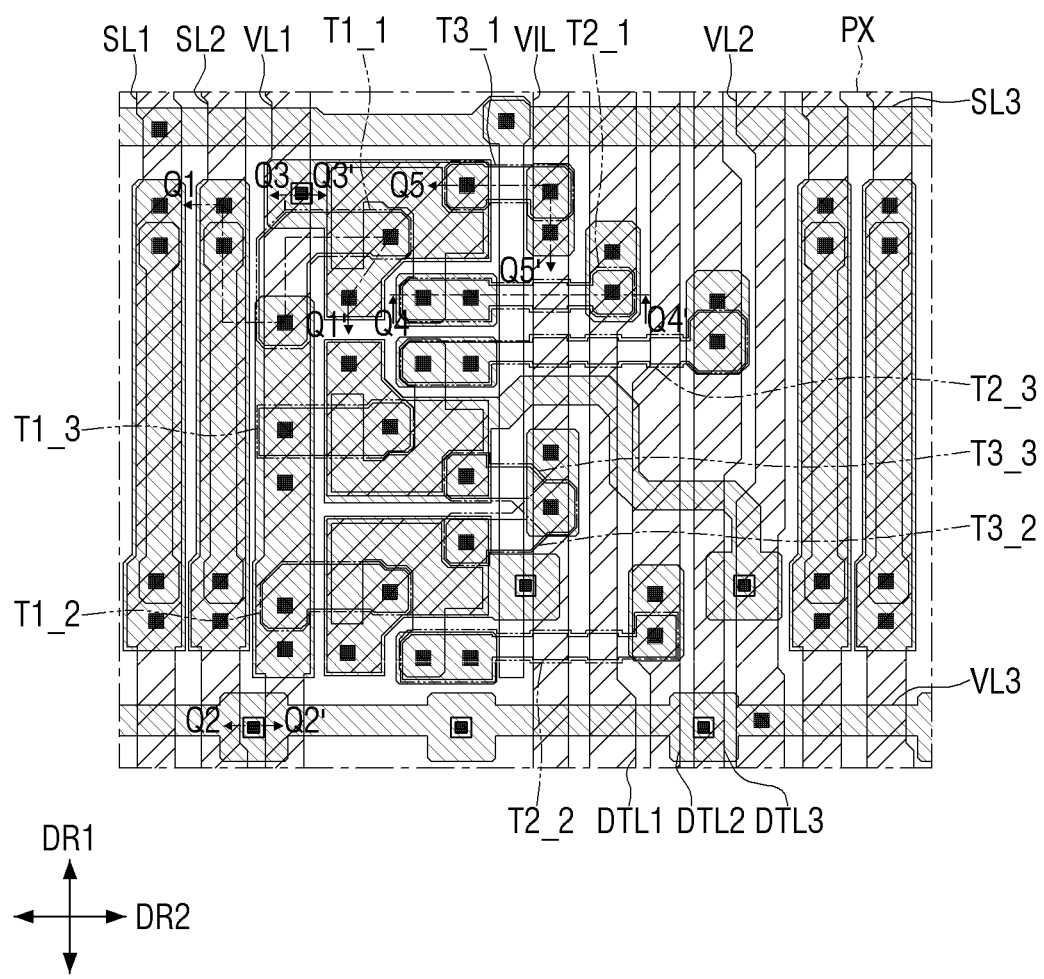
FIG. 4 is a layout view illustrating a plurality of wires disposed in one pixel of a display device according to one embodiment.
Figure 8:
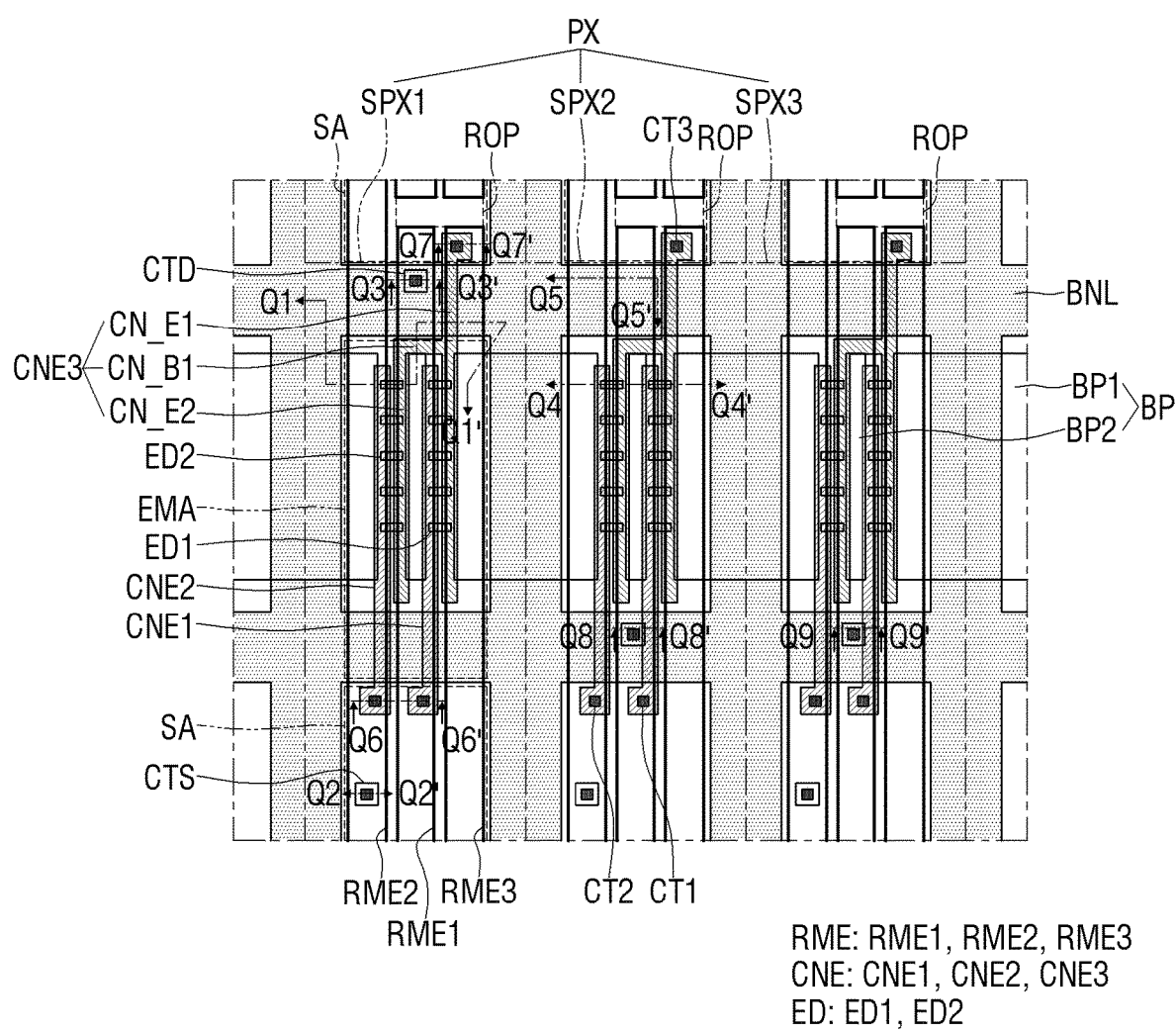
FIG. 8 is a schematic plan view illustrating a plurality of electrodes and a bank included in one pixel of a display device according to one embodiment.
Figure 14:
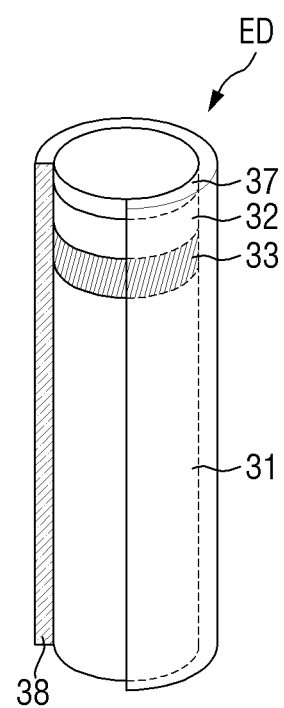
Figure 15:
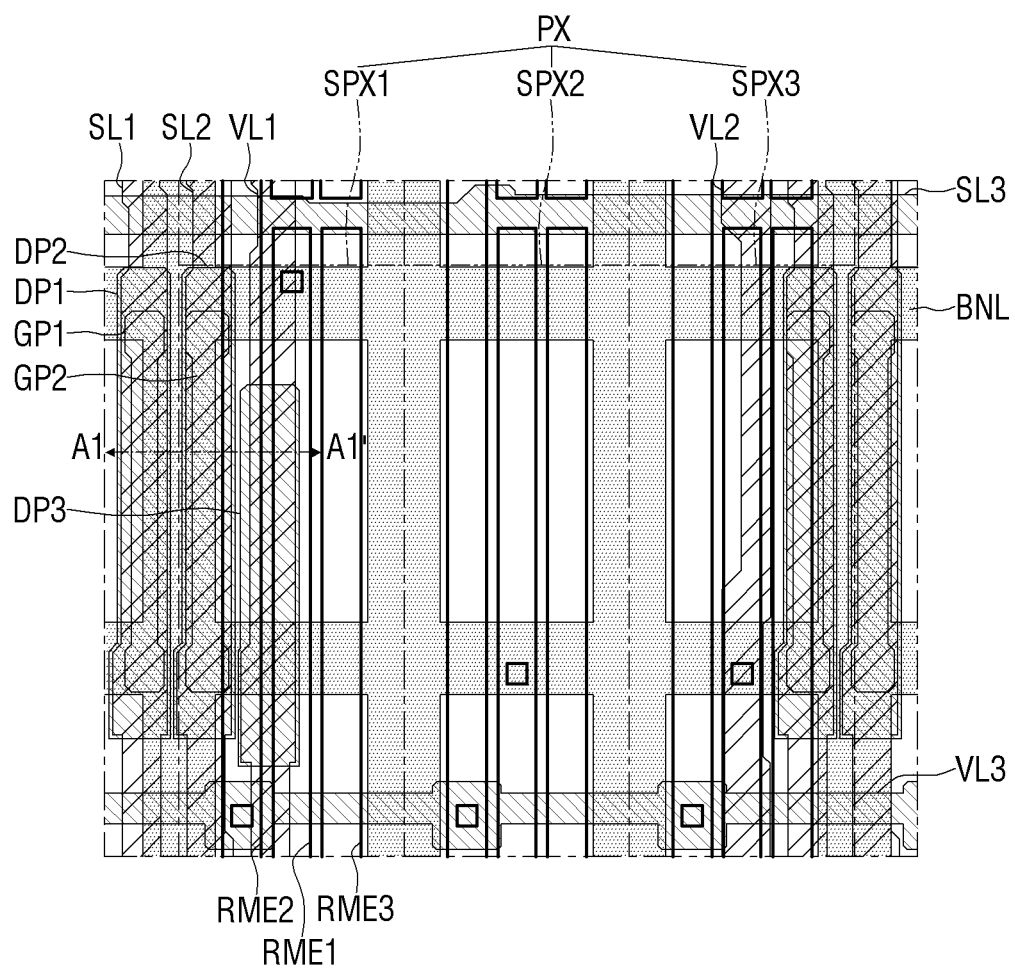
Figure 16:
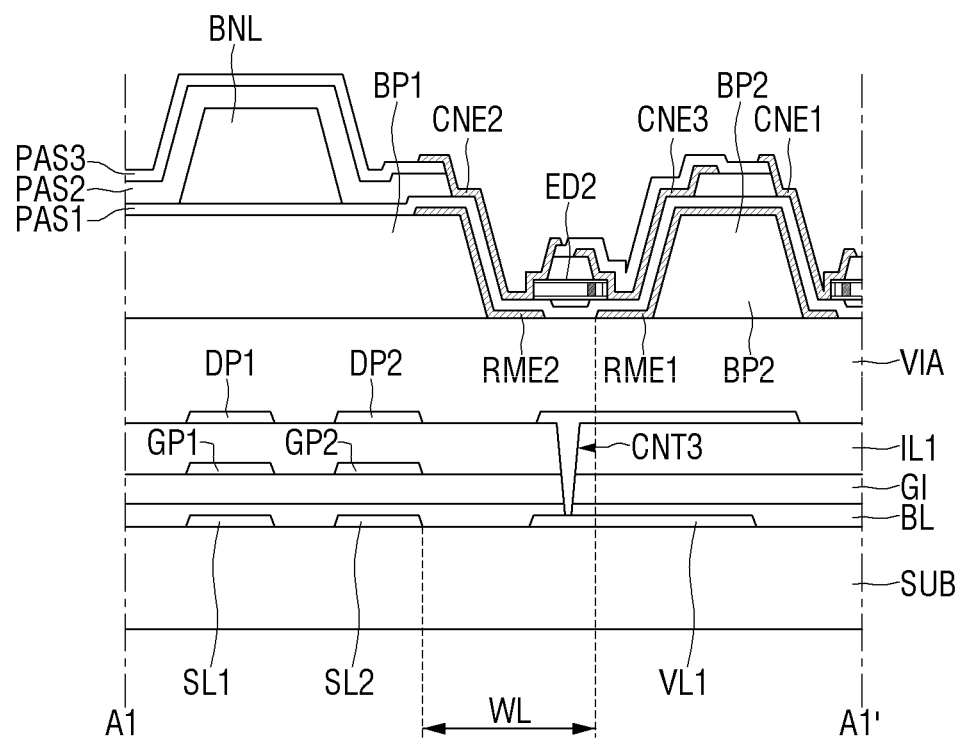
Figure 17:
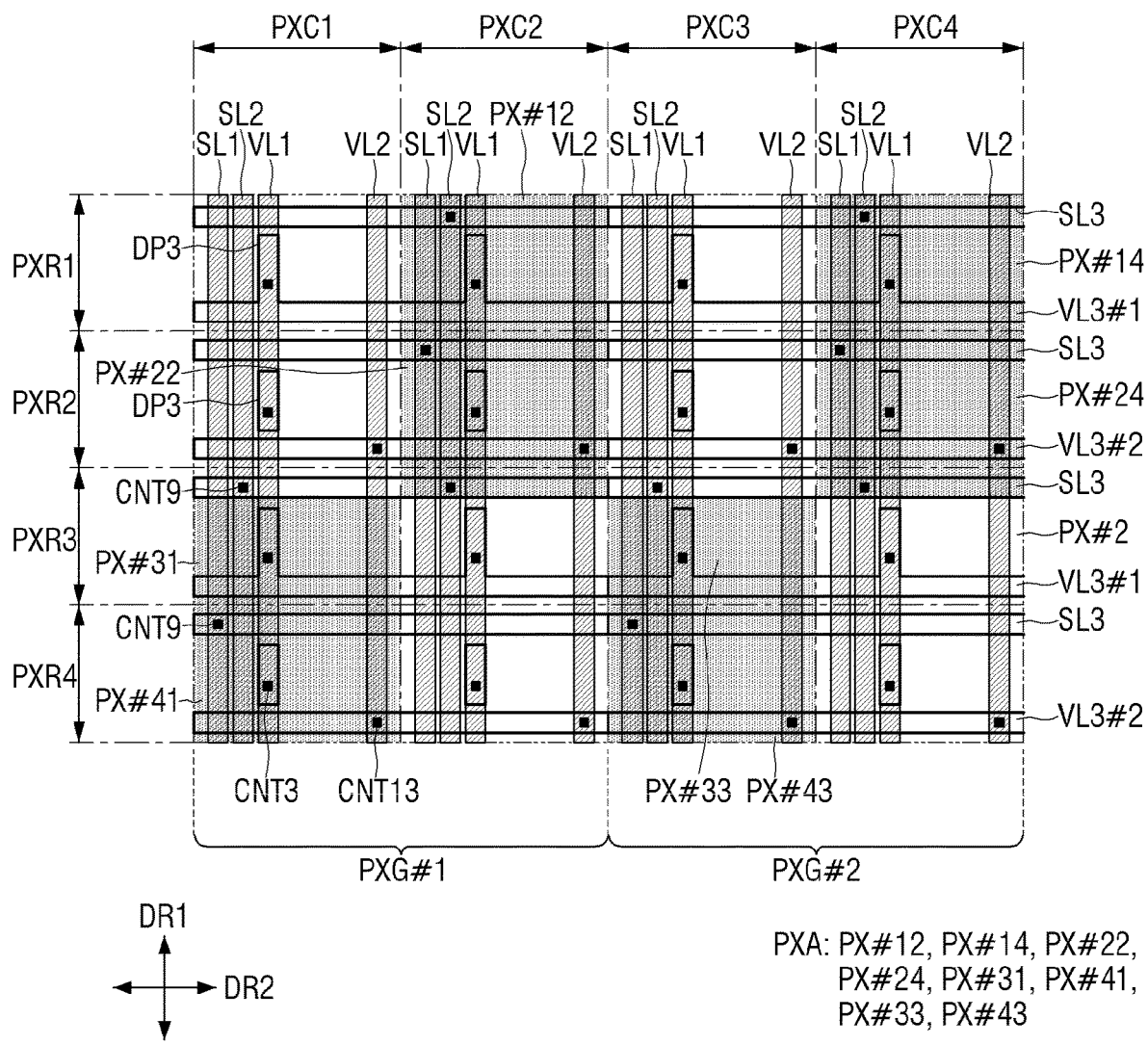
Figure 18:
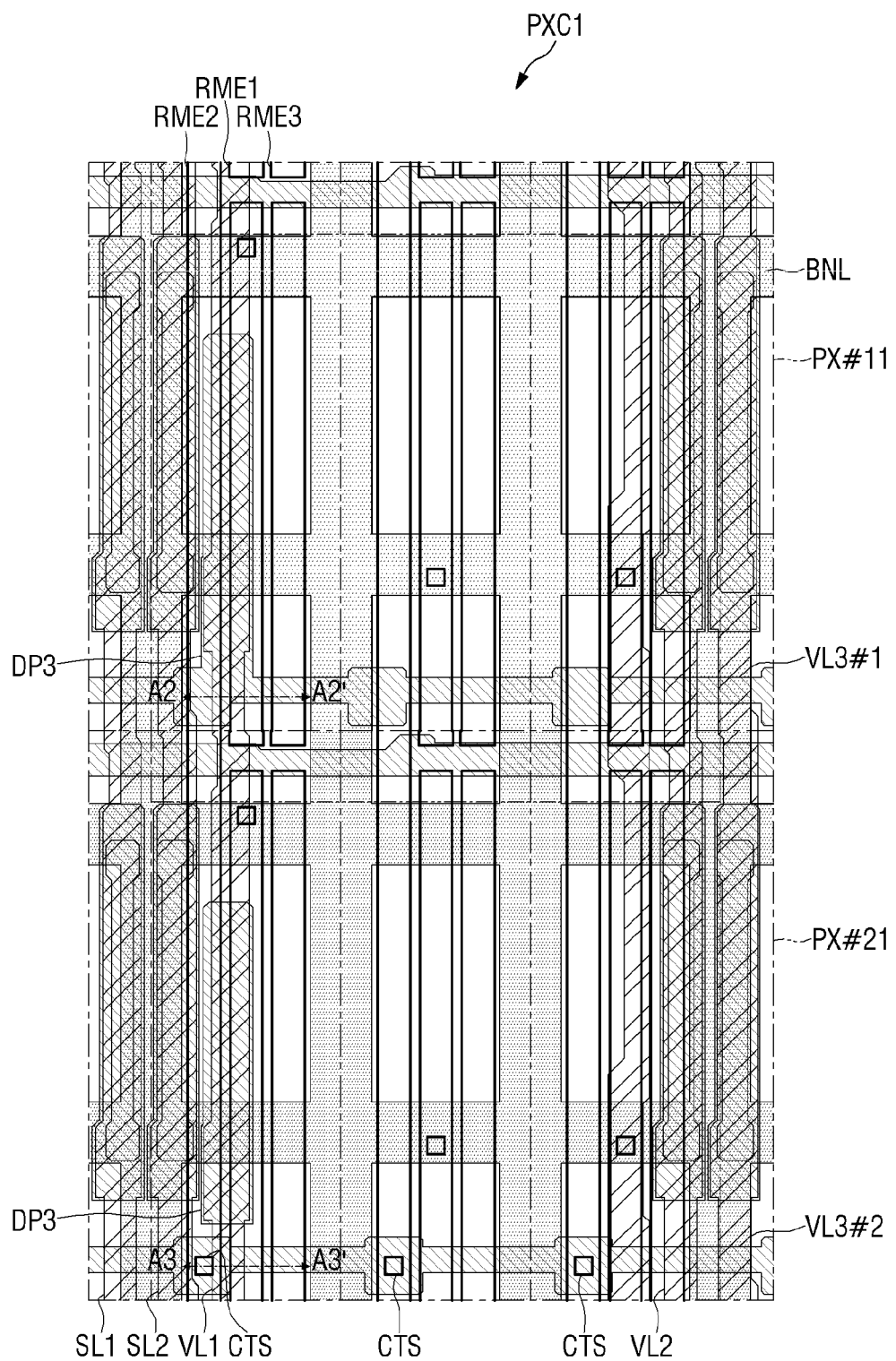
Figure 19:
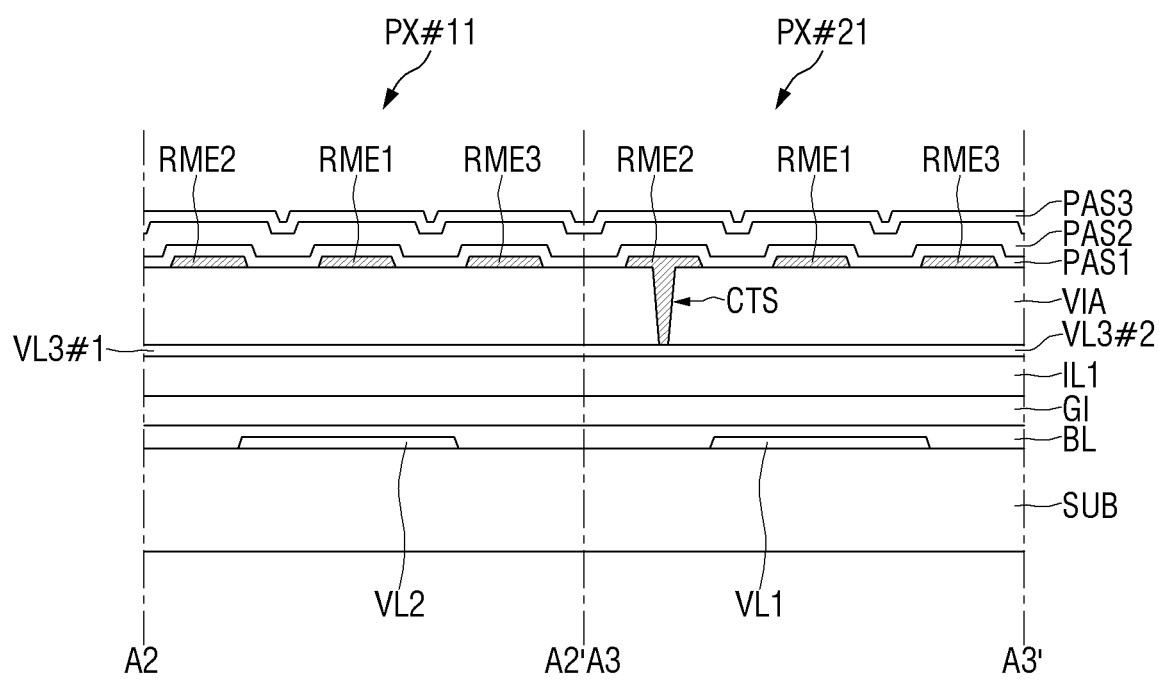
Figure 20:
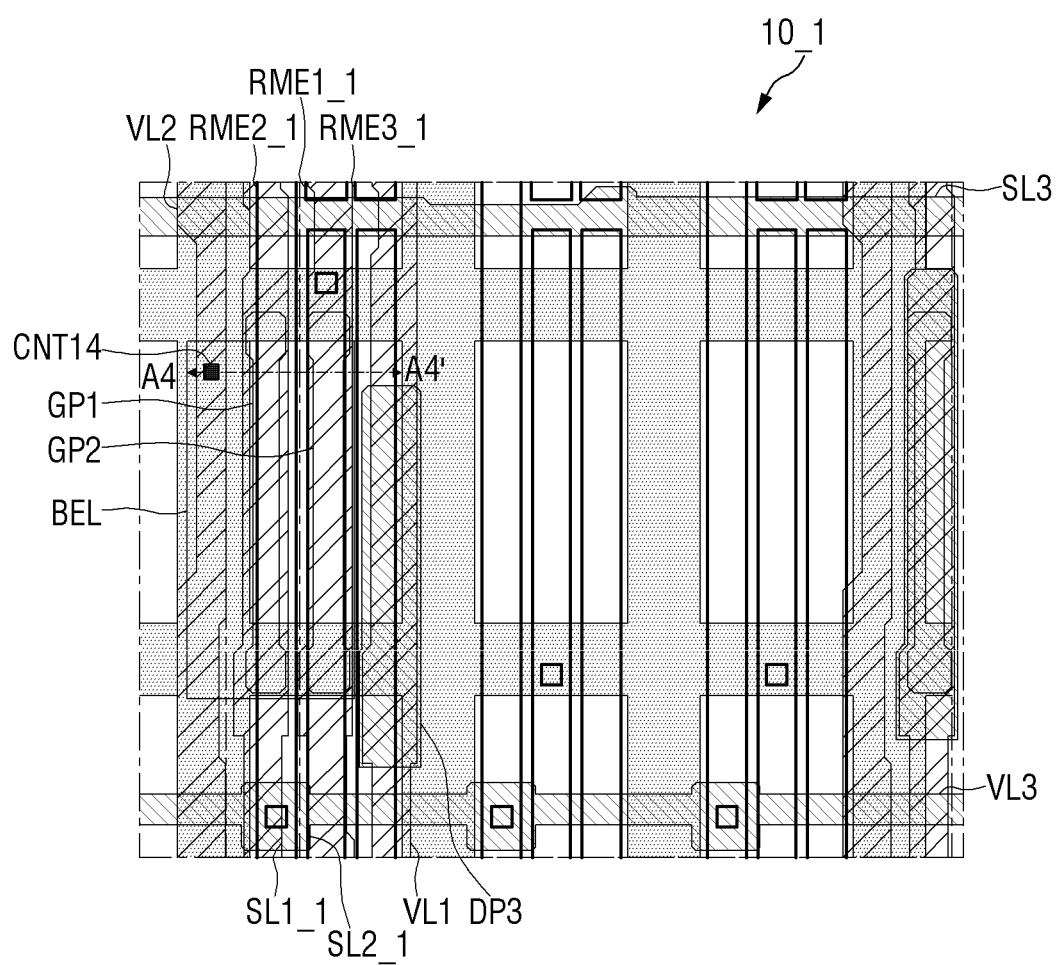
Figure 21:
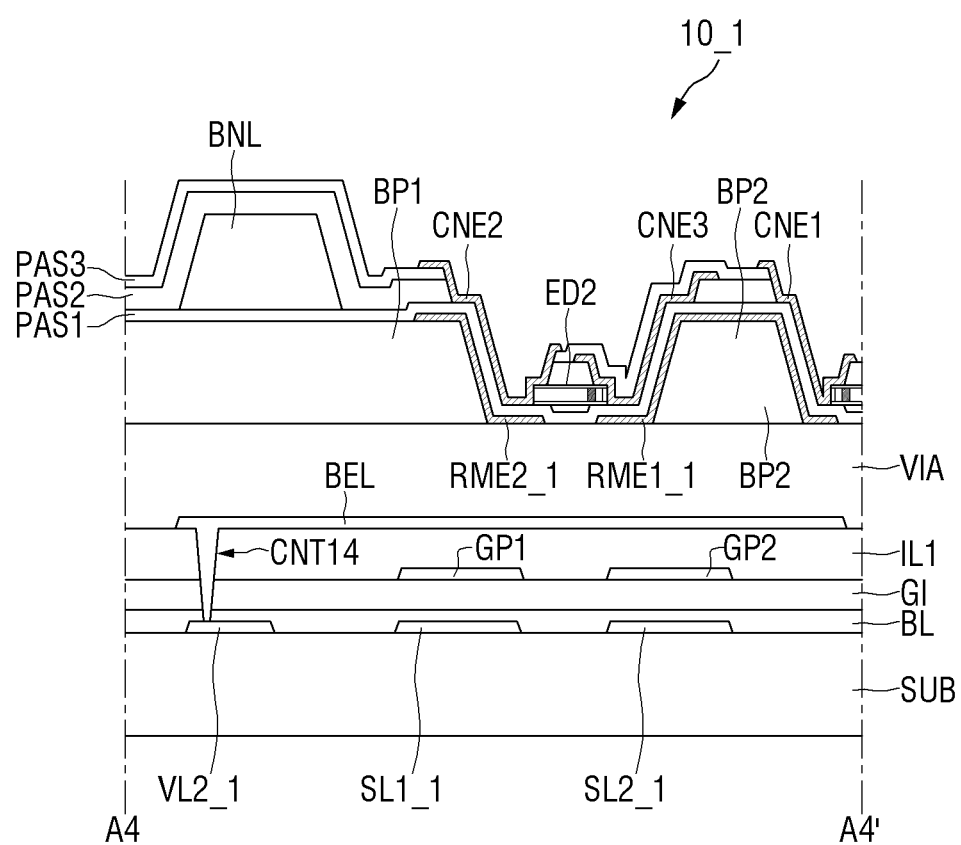

Q9-Q9' of FIGS. 4 and 8;

FIG. 14 is a schematic cutaway view of a light emitting element according to one embodiment;

FIG. 15 is a plan view illustrating a relative disposition of some of lower wires, a bank, and a plurality of electrodes disposed in one pixel of a display device according to one embodiment;

FIG. 16 is a cross-sectional view taken along the line A1-A1 in FIG. 15;

FIG. 17 is a schematic view illustrating a relative disposition of a plurality of wires disposed on a plurality of pixels of a display device according to one embodiment;

FIG. 18 is a schematic view illustrating a relative disposition of a plurality of wires, a bank, electrodes of neighboring pixels of a display device according to one embodiment;

FIG. 19 is a cross-sectional view taken along the lines A2-A2' and A3-A3' of FIG. 18;

FIG. 20 is a layout view illustrating a disposition of some wires and electrodes disposed in one pixel among a plurality of wires of a display device according to an embodiment;

FIG. 21 is a cross-sectional view taken along the line A4-A4' in FIG. 20; and

Figure 22:
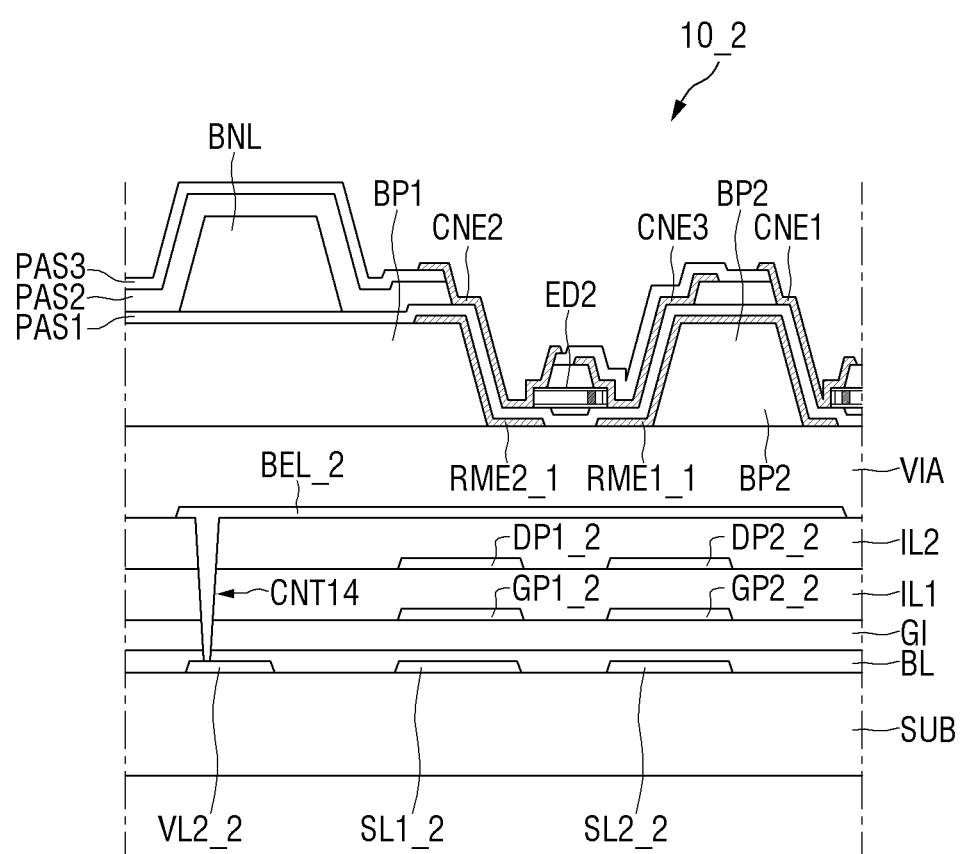

FIG. 22 is a cross-sectional view illustrating a portion of a display device according to an embodiment.

DETAILED DESCRIPTION

Aspects and features of embodiments of the present disclosure will now be described more fully hereinafter with reference to the accompanying drawings, in which embodiments of the present disclosure are shown. This disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the present disclosure. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present disclosure refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Hereinafter, embodiments of the present disclosure will be described with reference to the accompanying drawings.

Figure 1:
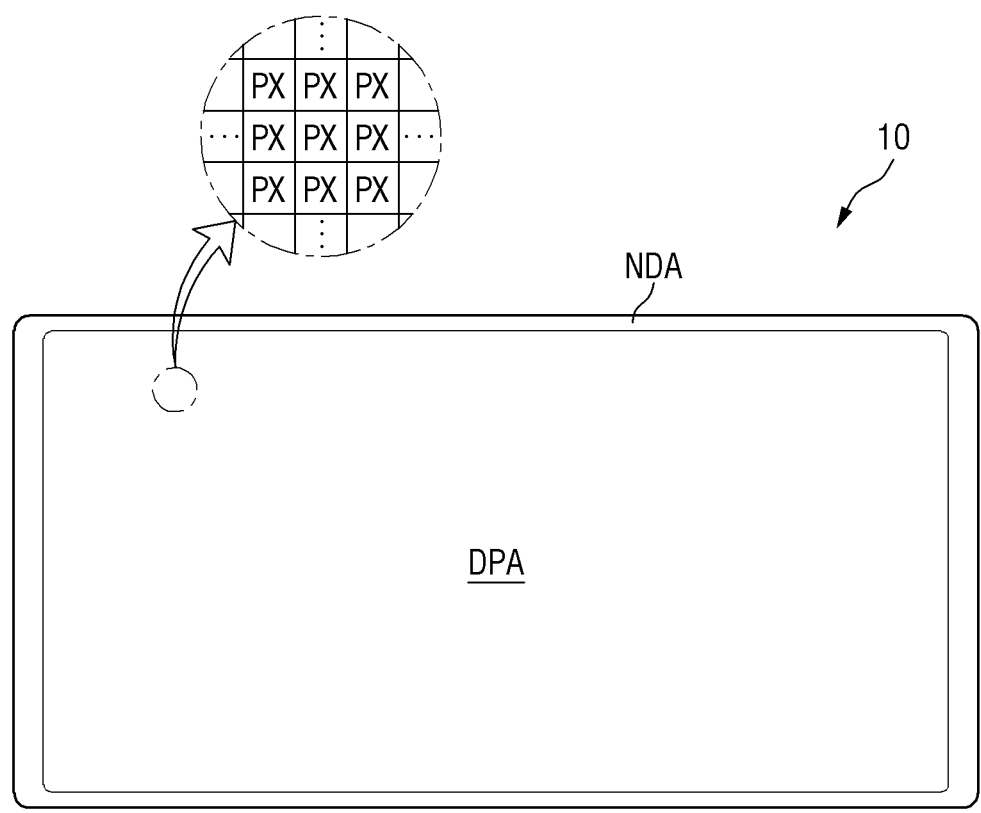
FIG. 1 is a schematic plan view of a display device according to one embodiment.

FIG. 1 is a schematic plan view of a display device according to one embodiment.

Referring to FIG. 1, a display device 10 displays a moving image or a still image. The display device 10 may refer to any electronic device providing a display screen. Examples of the display device 10 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which provide a display screen.

The display device 10 includes a display panel that provides a display screen. Examples of the display panel may include an inorganic light emitting diode display panel, an organic light emitting display panel, a quantum dot light emitting display panel, a plasma display panel, and a field emission display panel. In the following description, a case where an inorganic light emitting diode display panel is applied as a display panel will be shown as a non-limiting example, but the present disclosure is not limited thereto, and other display panels may be applied within the same scope of the technical spirit.

The shape of the display device 10 may be variously modified. For example, the display device 10 may have a shape such as a rectangular shape elongated in a horizontal direction, a rectangular shape elongated in a vertical direction, a square shape, a quadrilateral shape with rounded corners (e.g., vertices), another polygonal shape, and a circular shape. The shape of a display area DPA of the display device 10 may also be similar to the overall shape of the display device 10. FIG. 1 illustrates a display device 10 having a rectangular shape elongated in a second direction DR2.

The display device 10 may include the display area DPA and a non-display area NDA around (e.g., surrounding) the display area DPA along the edge or periphery of the display area DPA. The display area DPA is an area where a screen can be displayed, and the non-display area NDA is an area where a screen is not displayed. The display area DPA may also be referred to as an active region, and the non-display area NDA may also be referred to as a non-active region. The display area DPA may substantially occupy the center (or the central region) of the display device 10.

The display area DPA may include a plurality of pixels PX. The plurality of pixels PX may be arranged in a matrix. For example, the plurality of pixels PX may be arranged along rows and columns of a matrix. The shape of each pixel PX may be a rectangular or square shape in a plan view. However, the present disclosure is not limited thereto, and it may be a rhombic shape in which each side is inclined with respect to one direction. The pixels PX may be disposed in a stripe or a PENTILE® arrangement structure, but the present disclosure is not limited thereto. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea. In addition, each of the pixels PX may include one or more light emitting elements that emit light of a specific wavelength band to display a specific color.

The non-display area NDA may be disposed around the display area DPA. The non-display area NDA may completely or partially surround the display area DPA. The display area DPA may have a rectangular shape, and the non-display area NDA may be disposed adjacent to four sides of the display area DPA. The non-display area NDA may form a bezel of the display device 10. Wires or circuit drivers included in the display device 10 may be disposed in the non-display area NDA, or external devices may be mounted thereon.

Figure 2:
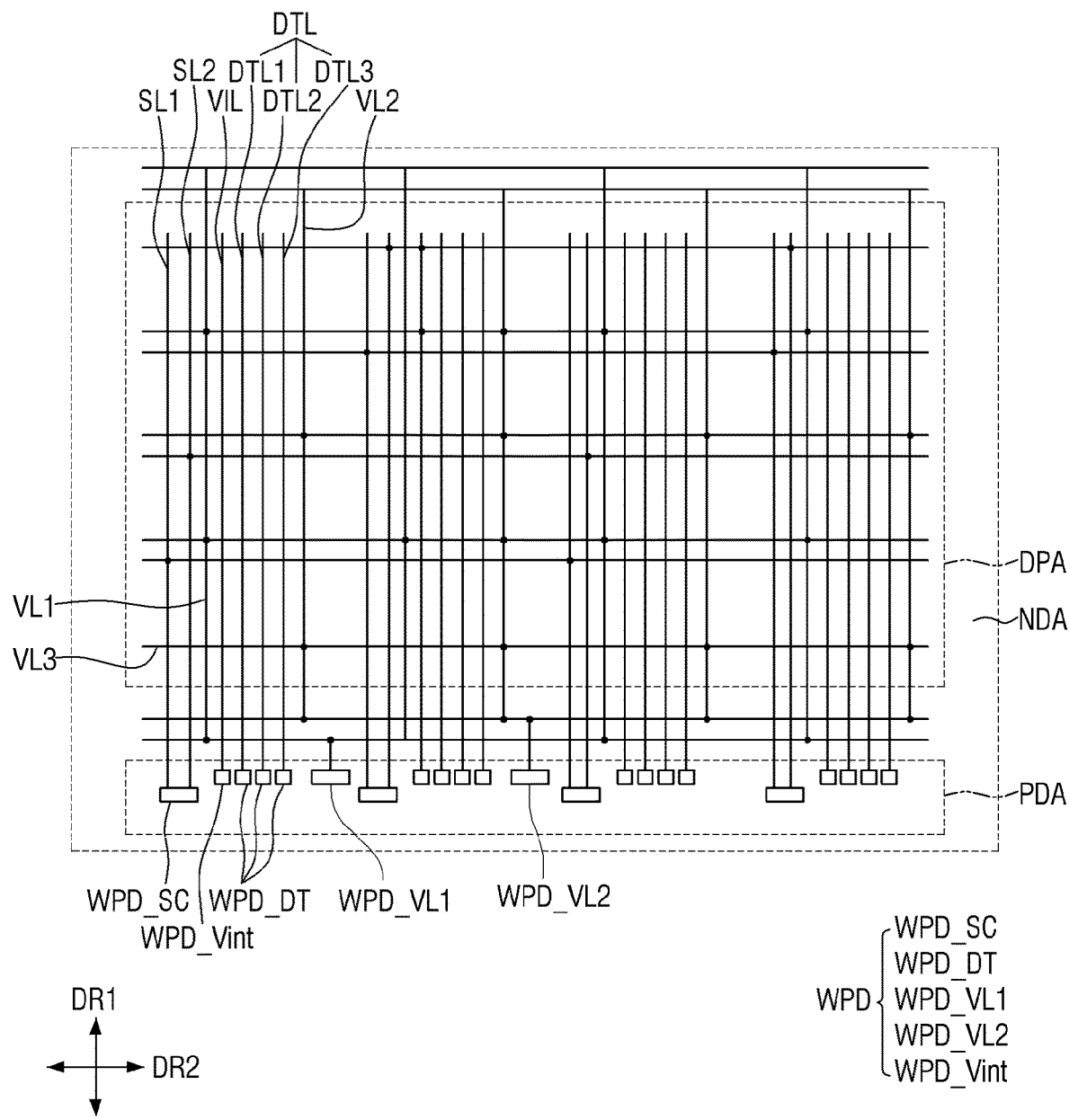
FIG. 2 is a schematic layout view illustrating a plurality of wires of a display device according to one embodiment.

FIG. 2 is a schematic layout diagram illustrating a plurality of wires of a display device according to one embodiment.

Referring to FIG. 2, the display device 10 may include a plurality of wires. The plurality of wires may include a plurality of scan lines SL1, SL2, and SL3 (e.g., as shown in FIG. 4), a plurality of data lines DTL1, DTL2, and DTL3, an initialization voltage wire VIL, and a plurality of voltage wires VL1, VL2, and VL3. Although not shown in FIG. 2, other wires may be further provided in the display device 10. The plurality of wires may include wires formed of a first conductive layer and extending in a first direction DR1, and wires formed of a third conductive layer and extending in the second direction DR2.

The first scan line SL1 and the second scan line SL2 may extend in the first direction DR1. The first scan line SL1 and the second scan line SL2 may be adjacent to each other, and may be spaced from a different first scan line SL1 and a different second scan line SL2 in the second direction DR2. The first scan line SL1 and the second scan line SL2 may be connected to a scan wire pad WPD_SC connected to a scan driver. The first scan line SL1 and the second scan line SL2 may extend from the pad area PDA disposed in the non-display area NDA to the display area DPA.

The third scan line SL3 (e.g., as shown in FIG. 4) may extend in the second direction DR2, and may be spaced from another third scan line SL3 in the first direction DR1. One third scan line SL3 may be connected to one or more first scan lines SL1 or one or more second scan lines SL2. The plurality of scan lines SL may have a mesh structure in the entire surface of the display area DPA, but the structure or arrangement of the plurality of scan lines SL is not limited thereto.

In some embodiments, the term "connected" as used herein may mean not only that one member is connected to another member through a physical contact, but also that one member is connected to another member through yet another member. This may also be understood as one part and the other part as integral elements are connected into an integrated element via another element. Furthermore, if one element is connected to another element, this may be construed as a meaning including an electrical connection via another element in addition to a direct connection in physical contact.

A data line DTL may extend in the first direction DR1. The data line DTL includes a first data line DTL1, a second data line DTL2, and a third data line DTL3, and the first to third data lines DTL1, DTL2, and DTL3 form a set and are disposed adjacent to each other. Each of the data lines DTL1, DTL2, and DTL3 may be connected to a corresponding one of data wire pads WPD_DT, which are different from each other, in the pad area PDA, and extend from the pad area PDA disposed in the non-display area NDA to the display area DPA.

The initialization voltage wire VIL may also extend in the first direction DR1. The initialization voltage wire VIL may be disposed between the data lines DTL and the second scan line SL2. The initialization voltage wire VIL may be connected to an initialization wire pad WPD_Vint in the pad area PDA, and may extend from the pad area PDA disposed in the non-display area NDA to the display area DPA.

The first voltage wire VL1 and the second voltage wire VL2 extends in the first direction DR1, and the third voltage wire VL3 is disposed to extend in the second direction DR2 crossing the first direction DR1. As will be described later, the first voltage wire VL1 and the second voltage wire VL2 may be formed of the first conductive layer, and the third voltage wire VL3 may be formed of the third conductive layer disposed on a layer different from the first conductive layer. The first voltage wire VL1 and the second voltage wire VL2 may extend in the first direction DR1 to cross the display area DPA, and as for the third voltage wire VL3, some of the wires may be disposed in the display area DPA and other wires may be disposed in the non-display area NDA positioned on both sides of the display area DPA in the first direction DR1, respectively. The first voltage wire VL1 and the second voltage wire VL2 may be connected to at least one third voltage wire VL3, and may be connected to the third voltage wires VL3 that are different from each other. The plurality of voltage wires VL may have a mesh structure on the entire surface of the display area DPA.

The first scan line SL1, the second scan line SL2, the data line DTL, the initialization voltage wire VIL, the first voltage wire VL1, and the second voltage wire VL2 may be electrically connected to at least one wire pad WPD. Each wire pad WPD may be disposed in the non-display area NDA. In one embodiment, each of the wire pads WPD may be disposed in the pad area PDA positioned on the lower side, which is the other side of the display area DPA in the first direction DR1. The first scan line SL1 and the second scan line SL2 are connected to the scan wire pad WPD_SC disposed in the pad area PDA, and the plurality of data lines DTL are connected to the data wire pads WPD_DT that are different from each other, respectively. The initialization voltage wire VIL is connected to the initialization wire pad WPD_Vint, the first voltage wire VL1 is connected to a first voltage wire pad WPD_VL1, and the second voltage wire VL2 is connected to a second voltage wire pad WPD_VL2. The external devices may be mounted on the wire pads WPD. The external devices may be mounted on the wire pads WPD by applying an anisotropic conductive film, ultrasonic bonding or the like. FIG. 2 shows as a non-limiting example that each of the wire pads WPD is disposed on the pad area PDA disposed on the lower side of the display area DPA, but the present disclosure is not limited thereto. Some of the plurality of wire pads WPD may be disposed in any one area on the upper side or on the left and right sides of the display area DPA.

Each pixel PX or sub-pixel PXn (n is an integer of 1 to 3) of the display device 10 includes a pixel driving circuit. The above-described wires may pass through each pixel PX or the periphery thereof to apply a driving signal to each pixel driving circuit. The pixel driving circuit may include transistors and capacitors. The number of transistors and capacitors of each pixel driving circuit may be variously modified. According to one embodiment, in each sub-pixel PXn of the display device 10, the pixel driving circuit may have a 3T1C structure including three transistors and one capacitor. Hereinafter, the pixel driving circuit of the 3T1C structure will be described as an example, but the disclosure is not limited thereto, and various other modified pixel PX structures such as a 2T1C structure, a 7T1C structure, and a 6T1C structure may be applied.

Figure 3:
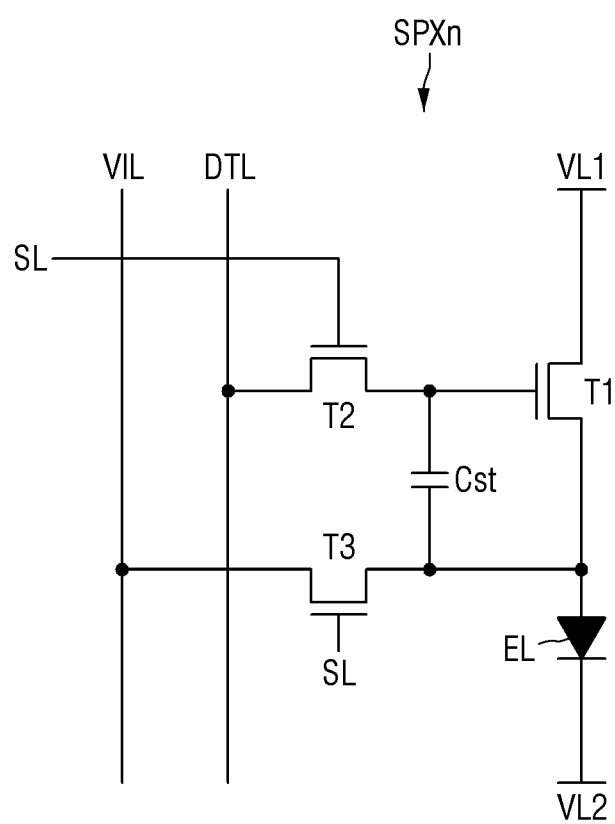
FIG. 3 is an equivalent circuit diagram of a sub-pixel according to one embodiment.

FIG. 3 is an equivalent circuit diagram of a sub-pixel according to one embodiment.

Referring to FIG. 3, each sub-pixel PXn of the display device 10 according to one embodiment includes three transistors T1, T2, and T3 and one storage capacitor Cst in addition to a light emitting diode EL.

The light emitting diode EL emits light by a current supplied through a first transistor T1. The light emitting diode EL includes a first electrode, a second electrode, and at least one light emitting element disposed between them. The light emitting element may emit light of a specific wavelength band by electrical signals transmitted from the first electrode and the second electrode.

One end of the light emitting diode EL may be connected to the source electrode of the first transistor T1, and the other end thereof may be connected to the second voltage wire VL2 to which a low potential voltage (hereinafter, a second power voltage) lower than a high potential voltage (hereinafter, a first power voltage) of the first voltage wire VL1 is supplied. In other embodiments, the other end of the light emitting diode EL may be connection to another suitable electrode, such as, for example, the source electrode of the second transistor T2.

The first transistor T1 adjusts a current flowing from the first voltage wire VL1, to which the first power voltage is supplied, to the light emitting diode EL according to the voltage difference between the gate electrode and the source electrode of the first transistor T1. For example, the first transistor T1 may be a driving transistor for driving the light emitting diode EL. The gate electrode of the first transistor T1 may be connected to the source electrode of the second transistor T2, the source electrode of the first transistor T1 may be connected to the first electrode of the light emitting diode EL, and the drain electrode of the first transistor T1 may be connected to the first voltage wire VL1 to which the first power voltage is applied.

The second transistor T2 is turned on by a scan signal of the scan line SL to connect the data line DTL to the gate electrode of the first transistor T1. The gate electrode of the second transistor T2 may be connected to the scan line SL, the source electrode thereof may be connected to the gate electrode of the first transistor T1, and the drain electrode thereof may be connected to the data line DTL.

The third transistor T3 is turned on by a scan signal of the scan line SL to connect the initialization voltage wire VIL to one end of the light emitting diode EL or to the source electrode of the first transistor T1. The gate electrode of the third transistor T3 may be connected to the scan line SL, the drain electrode thereof may be connected to the initialization voltage wire VIL, and the source electrode thereof may be connected to one end of the light emitting diode EL or to the source electrode of the first transistor T1. The second transistor T2 and the third transistor T3 may be concurrently turned on (e.g., simultaneously turned on) by the same scan signal.

In one embodiment, the source electrode and the drain electrode of each of the transistors T1, T2, and T3 are not limited to those described above, and vice versa. Further, each of the transistors T1, T2, and T3 may be formed of a thin film transistor (TFT). In addition, in FIG. 3, each of the transistors T1, T2, and T3 has been described as being formed of an N-type metal oxide semiconductor field effect transistor (MOSFET), but is not limited thereto. For example, each of the transistors T1, T2, and T3 may be formed of a P-type MOSFET. Alternatively, some of the transistors T1, T2, and T3 may be formed of an N-type MOSFET and the others may be formed of a P-type MOSFET.

The storage capacitor Cst is formed between the gate electrode and the source electrode of the first transistor T1. The storage capacitor Cst stores a difference voltage (or charge) between a gate voltage and a source voltage of the first transistor T1. For example, the storage capacitor Cst holds a voltage corresponding to the gate to source voltage of the first transistor T1 or a voltage corresponding to the data signal supplied from the data line DTL via the second transistor T2.

Hereinafter, a structure of one pixel PX of the display device 10 according to one embodiment will be described in detail additionally with reference to other drawings.

Figure 5:
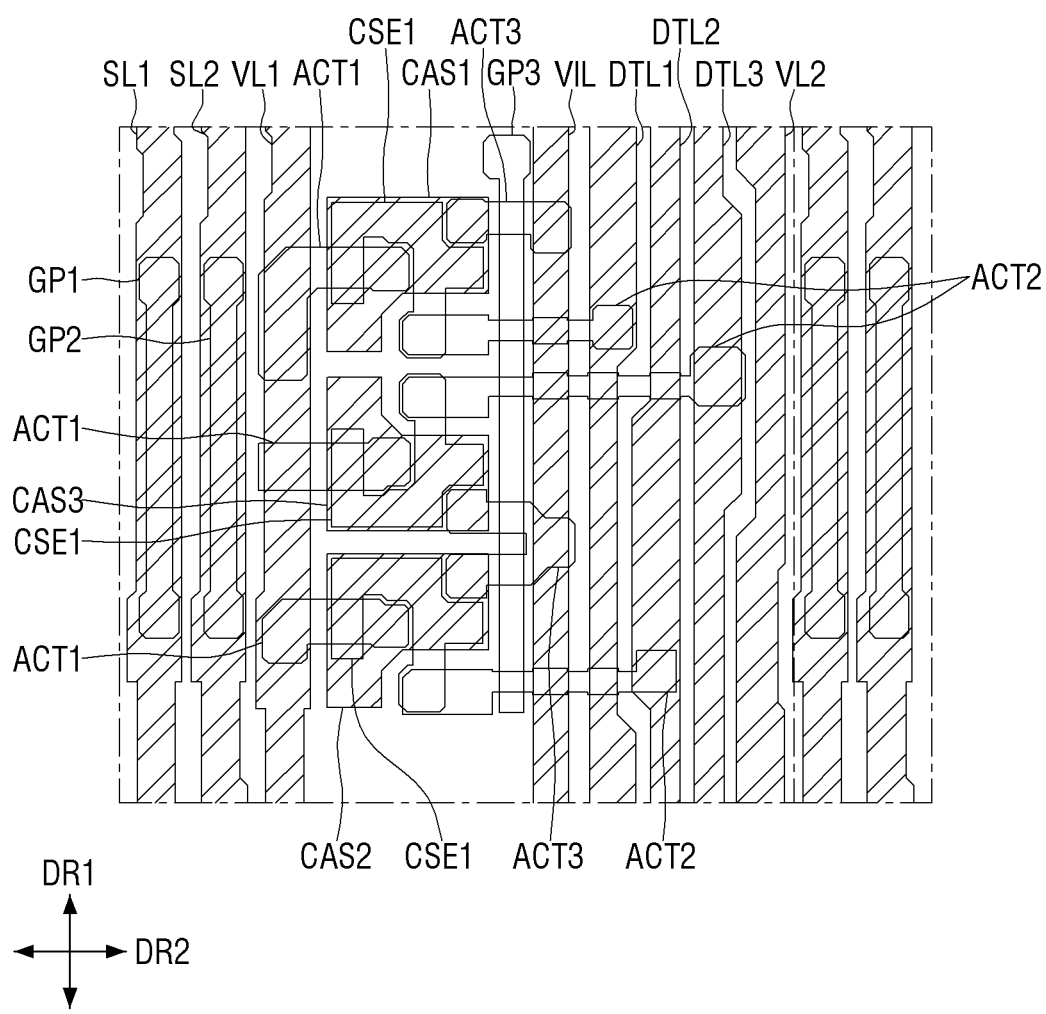
FIGS. 5 and 6 are layout views illustrating some wires of the plurality of wires of FIG. 4 that are distinguished.
Figure 6:
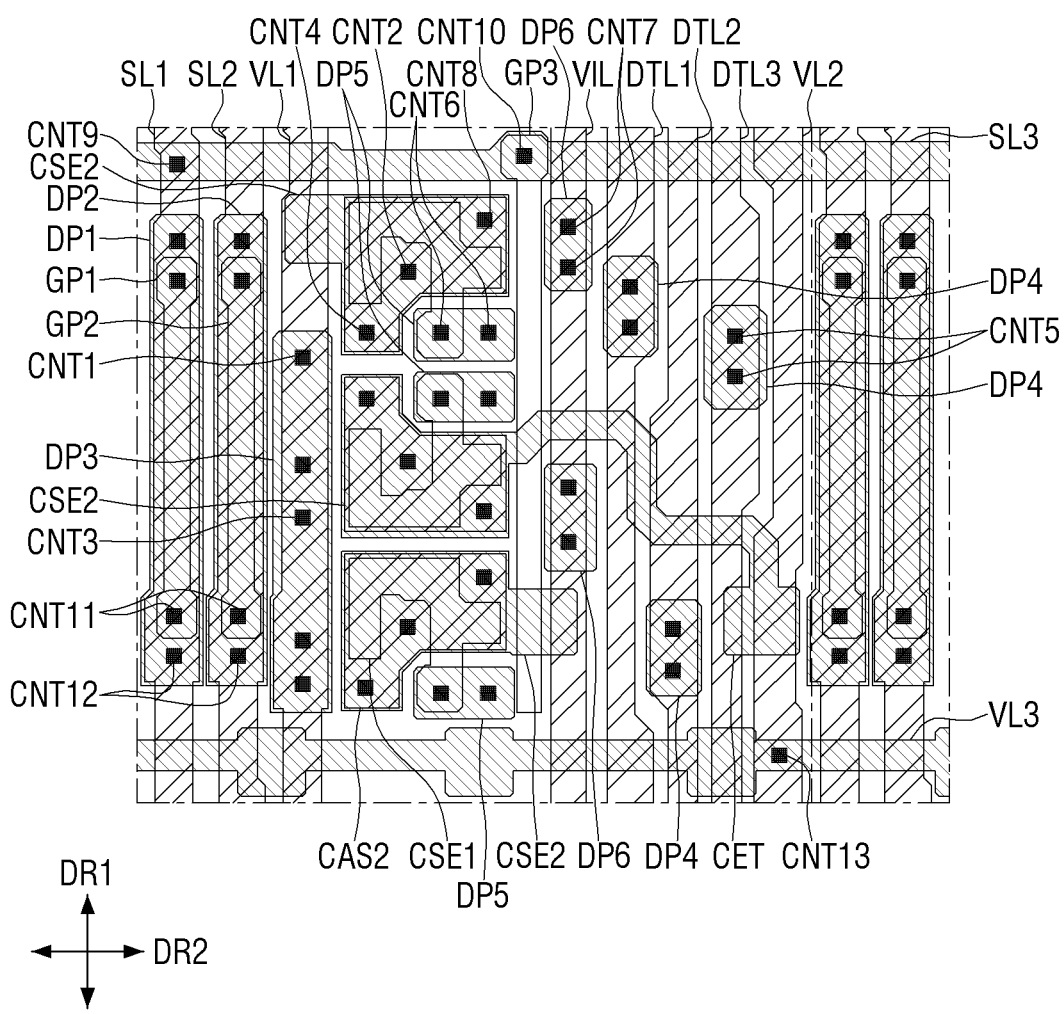
Figure 7:
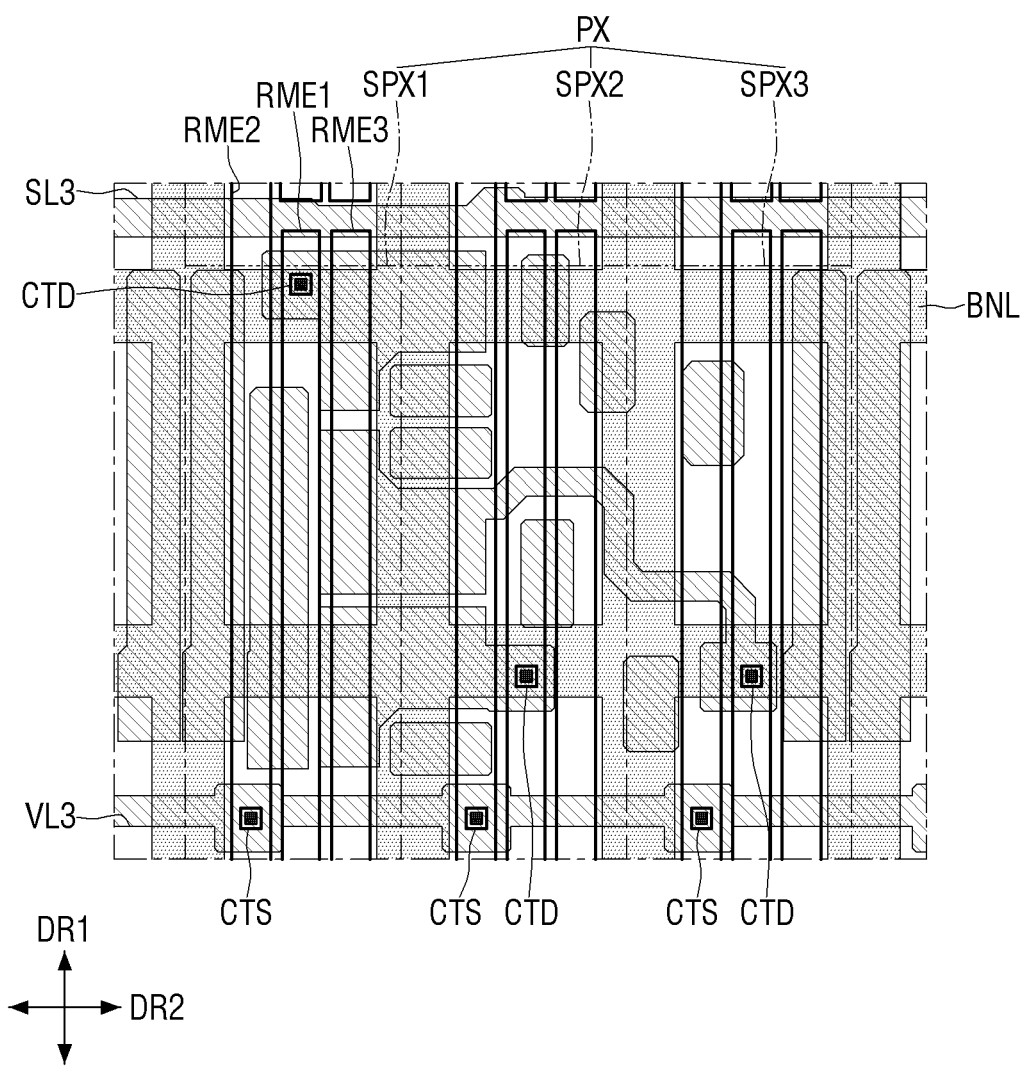
FIG. 7 is a layout view illustrating a disposition of some wires of the plurality of wires and the electrodes disposed in one pixel of FIG. 4.
Figure 9:
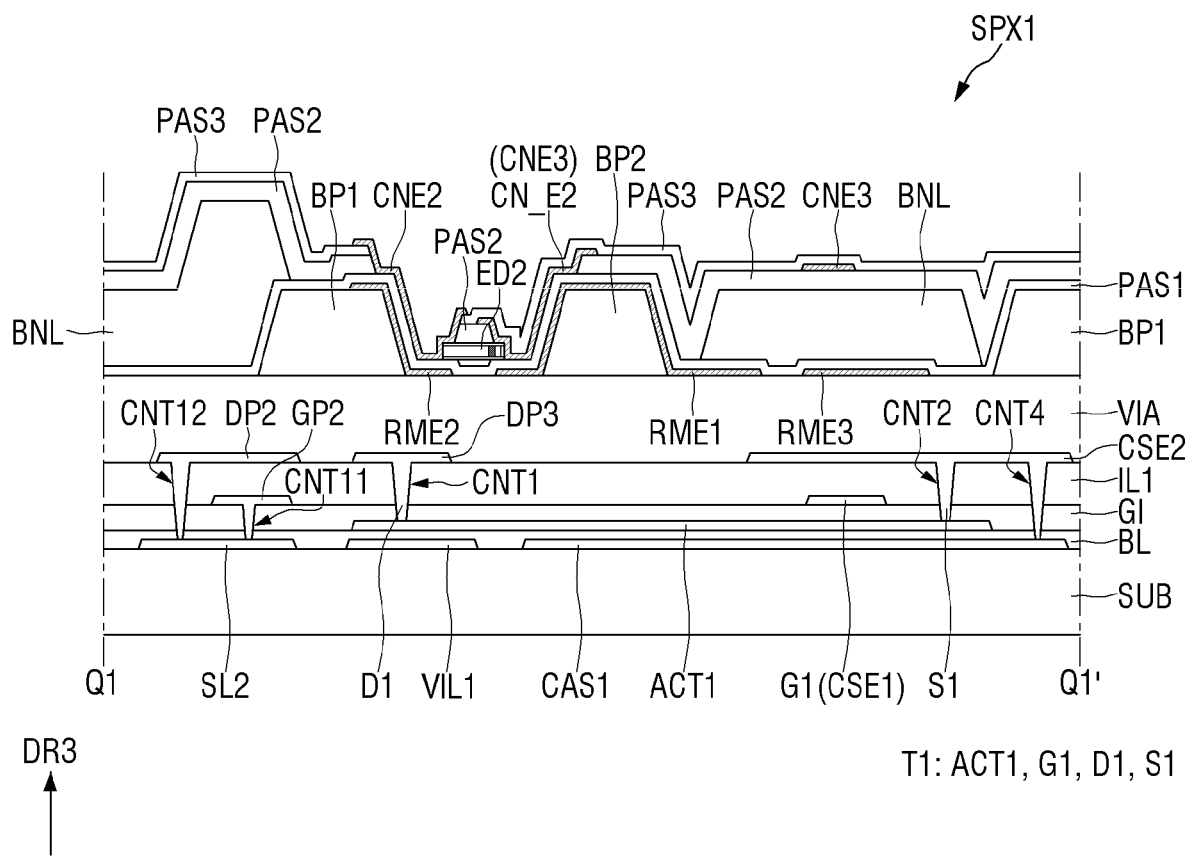
FIG. 9 is a cross-sectional view taken along the line Q1-Q1' of FIGS. 4 and 8.
Figure 10:
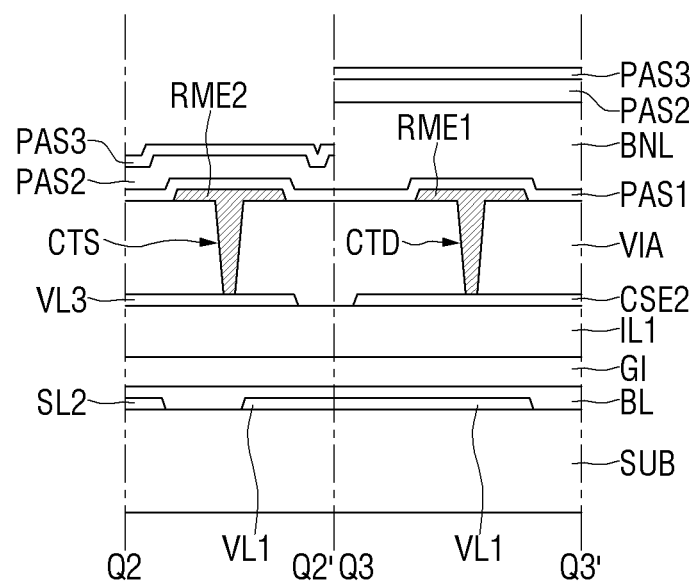
FIG. 10 is a cross-sectional view taken along the lines Q2-Q2' and Q3-Q3' of FIGS. 4 and 8.
Figure 11:
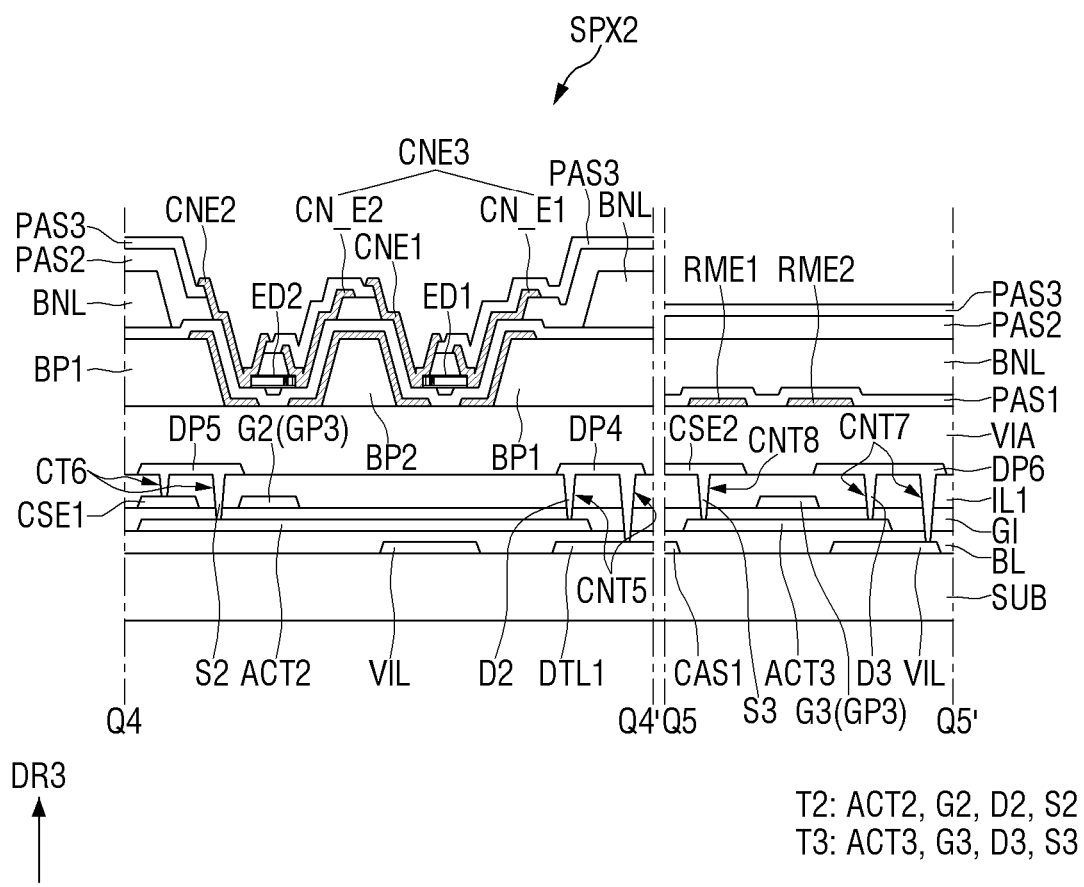
FIG. 11 is a cross-sectional view taken along the lines Q4-Q4' and Q5-Q5' of FIGS. 4 and 8.
Figure 12:
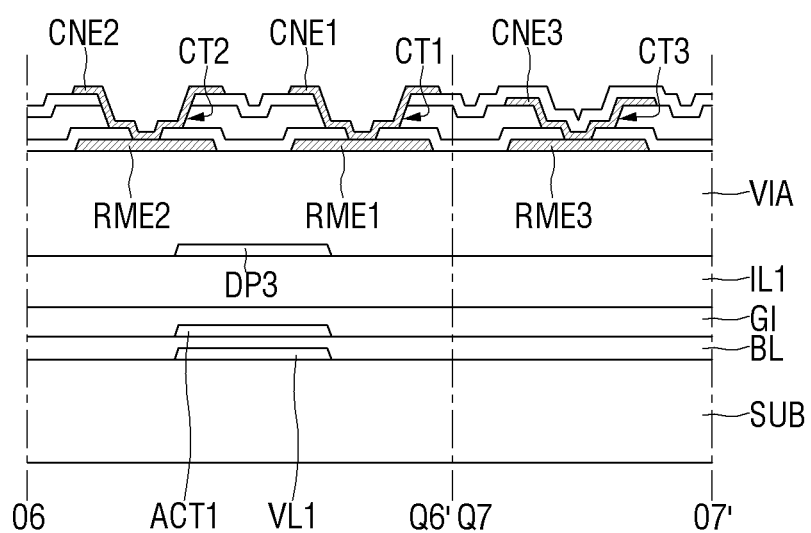
FIG. 12 is a cross-sectional view taken along the lines Q6-Q6' and Q7-Q7' in FIGS. 4 and 8.
Figure 13:
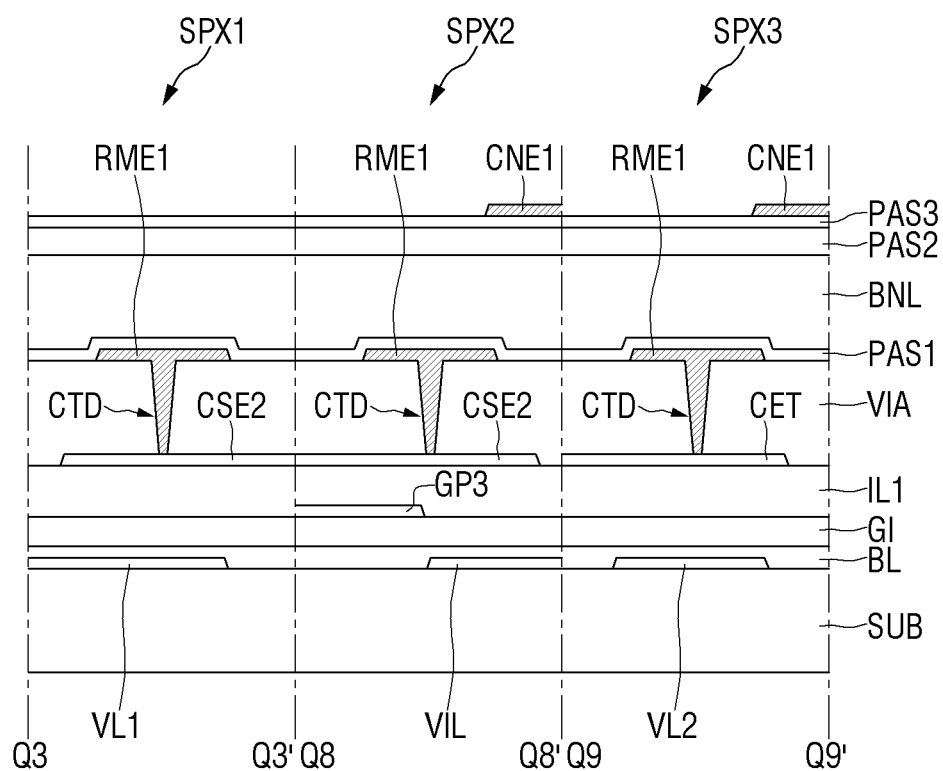
FIG. 13 is a cross-sectional view taken along the lines Q3-Q3', Q8-Q8'.

FIG. 4 is a layout view illustrating a plurality of wires disposed in one pixel of a display device according to one embodiment. FIGS. 5 and 6 are layout views illustrating some wires of the plurality of wires of FIG. 4 that are distinguished. FIG. 7 is a layout view illustrating a disposition of some wires of the plurality of wires and the electrodes disposed in one pixel of FIG. 4. FIG. 8 is a schematic plan view illustrating a plurality of electrodes and a bank included in one pixel of a display device according to one embodiment. FIG. 9 is a cross-sectional view taken along the line Q1-Q1' of FIGS. 4 and 8. FIG. 10 is a cross-sectional view taken along the lines Q2-Q2' and Q3-Q3' of FIGS. 4 and 8. FIG. 11 is a cross-sectional view taken along the lines Q4-Q4' and Q5-Q5' of FIGS. 4 and 8. FIG. 12 is a cross-sectional view taken along the lines Q6-Q6' and Q7-Q7' in FIGS. 4 and 8. FIG. 13 is a cross-sectional view taken along the lines Q3-Q3', Q8-Q8', and Q9-Q9' of FIGS. 4 and 8.

FIG. 4 is a layout view illustrating wires of the first conductive layer, a second conductive layer, and the third conductive layer as a plurality of wires disposed in one pixel PX of the display device 10, and active layers ACT of a semiconductor layer. FIG. 5 illustrates the first conductive layer, the semiconductor layer, and the second conductive layer together, and FIG. 6 illustrates only the first conductive layer, the second conductive layer, and the third conductive layer. FIG. 7 illustrates a disposition of the third conductive layer and electrodes RME disposed thereon, and FIG. 8 illustrates a disposition of a plurality of electrodes RME disposed on the plurality of wires, a bank BNL, and light emitting elements ED. FIG. 9 illustrates a cross-section of the first transistor T1 connected to a first sub-pixel SPX1 of one pixel PX, and FIG. 10 illustrates a portion in which some of the electrodes RME of the first sub-pixel SPX1 and the third conductive layer are connected. FIG. 11 respectively illustrates cross-sections of the second transistor T2 and the third transistor T3 that are connected to the first sub-pixel SPX1, and FIG. 12 illustrates cross-sections of a portion in which the electrodes RME and a connection electrodes CNE are connected. FIG. 13 illustrates a portion in which a first electrode RME1 of each sub-pixel SPXn is connected to the lower conductive layer.

Referring to FIGS. 4-13, the pixel PX of the display device 10 may include a plurality of sub-pixels SPXn (n is 1 to 3). For example, one pixel PX may include a first sub-pixel SPX1, a second sub-pixel SPX2, and a third sub-pixel SPX3. The first sub-pixel SPX1 may emit light of a first color, the second sub-pixel SPX2 may emit light of a second color, and the third sub-pixel SPX3 may emit light of a third color. For example, the first color may be red, the second color may be green, and the third color may be blue. However, the disclosure is not limited thereto, and the sub-pixels SPXn may emit light of the same color. In one embodiment, each of the sub-pixels SPXn may emit blue light. In addition, although FIG. 2 illustrates that one pixel PX includes three sub-pixels SPXn, the disclosure is not limited thereto, and the pixel PX may include a larger number of sub-pixels SPXn.

Each sub-pixel SPXn of the display device 10 may include an emission area EMA and a non-emission area. The emission area EMA may be an area in which the light emitting element ED is disposed to emit light of a specific wavelength band. The non-emission area may be a region in which the light emitting element ED is not disposed and a region from which light is not emitted because light emitted from the light emitting element ED does not reach such region.

The emission area EMA may include an area in which the light emitting element ED is disposed, and an area adjacent to the light emitting element ED to emit light emitted from the light emitting element ED. Without being limited thereto, the emission area EMA may also include an area in which light emitted from the light emitting element ED is reflected or refracted by another member and emitted. The plurality of light emitting elements ED may be disposed in each sub-pixel SPXn, and the emission area may be formed to include an area where the light emitting elements ED are disposed and an area adjacent thereto.

Although it is shown in FIGS. 4-13 that the sub-pixels SPXn have the emission areas EMA that are substantially identical in size, the disclosure is not limited thereto. In some embodiments, the emission areas EMA of the sub-pixels SPXn may have different sizes according to a color or wavelength band of light emitted from the light emitting element ED disposed in each sub-pixel.

Each sub-pixel SPXn may further include a sub-region SA disposed in the non-emission area. The sub-region SA may be disposed on the lower side of the emission area EMA on the other side of the first direction DR1, and may be disposed between the emission areas EMA of the sub-pixels SPXn adjacent in the first direction DR1. The emission areas EMA and the sub-regions SA may be repeatedly arranged along the second direction DR2, while being alternately arranged along the first direction DR1. However, the disclosure is not limited thereto, and the emission areas EMA and the sub-regions SA of the plurality of pixels PX may have an arrangement different from that of FIG. 8. Light may not be emitted from the sub-region SA because the light emitting element ED is not disposed in the sub-region SA, but an electrode RME disposed in each sub-pixel SPXn may be partially disposed in the sub-region SA. The electrodes RME disposed in the sub-pixels SPXn different from each other may be disposed to be separated from each other by a separation portion ROP of the sub-region SA.

The bank BNL is disposed between the emission areas EMA and the sub-regions SA. The bank BNL may include portions extending in the first direction DR1 and the second direction DR2 in a plan view to be arranged in a grid pattern over the entire surface of the display area DPA. The bank BNL may be disposed across the boundary of each of the sub-pixels SPXn to distinguish the neighboring sub-pixels SPXn, or may be disposed to surround the emission area EMA of each sub-pixel SPXn to distinguish them. Intervals between the emission areas EMA, between the sub-regions SA, and between the emission area EMA and the sub-region SA may vary according to the width of the bank BNL.

Each of the wires and the circuit elements of a circuit layer disposed on each pixel PX and connected to the light emitting diode EL may be connected to the first to third sub-pixels SPX1, SPX2, and SPX3. However, the wires and the circuit elements may not be disposed to correspond to the area occupied by each sub-pixel SPXn or the emission area EMA, and may be disposed regardless of the position of the emission area EMA within one pixel PX.

In one pixel PX, a circuit layer connected to the first to third sub-pixels SPX1, SPX2, and SPX3 is disposed in a specific pattern, and the patterns may be repeatedly arranged in units of one pixel PX, not the sub-pixel SPXn. The sub-pixels SPXn disposed in one pixel PX are areas distinguished based on the emission area EMA and the sub-region SA, and the circuit layer connected to them may be disposed regardless of the area of the sub-pixel SPXn. The display device 10 according to one or more embodiments may reduce or minimize the area occupied by wires and elements connected to each sub-pixel SPXn by disposing the wires of the circuit layer and the elements based on the unit pixel PX, not the sub-pixel SPXn, and may be more suitable in implementing a high-resolution display device.

When the plurality of layers disposed on one pixel PX of the display device 10 are specifically described, the display device 10 may include a first substrate SUB, and a semiconductor layer, a plurality of conductive layers, and a plurality of insulating layers that are disposed on the first substrate SUB. The semiconductor layer, the conductive layers, and the insulating layers may each constitute a circuit layer and a display element layer of the display device 10.

The first substrate SUB may be an insulating substrate. The first substrate SUB may be made of an insulating material such as glass, quartz, or polymer resin. Further, the first substrate SUB may be a rigid substrate, but may also be a flexible substrate which can be bent, folded or rolled.

A first conductive layer may be disposed on the first substrate SUB. The first conductive layer includes the first scan line SL1 and the second scan line SL2 that extend in the first direction DR1, the plurality of data lines DTL1, DTL2, and DTL3, the first voltage wire VL1, the second voltage wire VL2, the initialization voltage wire VIL, and a plurality of lower metal layers CAS1, CAS2, and CAS3.

The plurality of scan lines SL are disposed to extend in the first direction DR1. The first scan line SL1 and the second scan line SL2 may be disposed in one pixel PX, and each of the scan lines SL1 and SL2 may be disposed over the plurality of pixels PX arranged along the first direction DR1. The first scan line SL1 and the second scan line SL2 may be spaced from each other in the second direction DR2 but disposed adjacent to each other. Any one scan line of the first scan line SL1 and the second scan line SL2 may be connected to one pixel PX, and the scan line connected to one pixel PX may be connected to each of the first to third sub-pixels SPX1, SPX2, and SPX3. The scan lines SL1 and SL2 may be connected to the second transistor ('T2' in FIGS. 3 and 4) and the third transistor ('T3' in FIGS. 3 and 4) through a conductive pattern disposed on the other conductive layer, and a scan signal may be applied to the second transistor T2 and the third transistor T3.

As described above, the first scan line SL1 and the second scan line SL2 may not be disposed to correspond to each area occupied by the first to third sub-pixels SPX1, SPX2, and SPX3, and may be disposed in a specific position within one pixel PX. In one embodiment, the first scan line SL1 and the second scan line SL2 may be disposed on the left side, which is the other side in the second direction DR2, of the center of the pixel PX, and may be disposed on, the area occupied by the first sub-pixel SPX1, and more specifically, the left side of the first sub-pixel SPX1 in a plan view.

The plurality of sub-pixels SPXn belonging to one pixel PX may be distinguished according to whether the scan lines SL1 and SL2 are disposed. For example, the first sub-pixel SPX1 may be a sub-pixel adjacent to the scan lines SL1 and SL2, and the second sub-pixel SPX2 and the third sub-pixel SPX3 may not be such a sub-pixel. Because the wires connected to each sub-pixel SPXn are disposed in a specific pattern with one pixel PX as a repeating unit regardless of the area occupied by each sub-pixel SPXn, the sub-pixels SPXn belonging to one pixel PX may have different patterns in the lower conductive layer. As will be described later, a plurality of electrodes RME1 and RME2 (and RME3) and a light emitting element ED may be disposed in each sub-pixel SPXn to emit light, and when a conductive layer having a different pattern for each sub-pixel SPXn is disposed, it may affect the amount of light emitted. The display device 10 according to one embodiment may have a structure that does not affect the amount of light emitted from each sub-pixel SPXn although the lower conductive layer disposed in the area occupied by each sub-pixel SPXn has a different pattern. A more detailed description thereof will be given later.

The plurality of data lines DTL1, DTL2, and DTL3 are disposed to extend in the first direction DR1. The first data line DTL1, the second data line DTL2, and the third data line DTL3 are disposed in one pixel PX, and each of the data lines DTL1, DTL2, and DTL3 may be disposed over the plurality of pixels PX arranged along the first direction DR1. The first data line DTL1, the second data line DTL2, and the third data line DTL3 may be spaced from each other in the second direction DR2 but may be disposed adjacent to each other. The first data line DTL1, the second data line DTL2, and the third data line DTL3 may be sequentially arranged along the second direction DR2, and may each be connected to the first sub-pixel SPX1, the second sub-pixel SPX2, and the third sub-pixel SPX3. Each of the data lines DTL1, DTL2, and DTL3 may be connected to a second transistor ('T2' in FIGS. 3 and 4) through a conductive pattern disposed on a different conductive layer to apply a data signal to the second transistor T2.

As described above, the first to third data lines DTL1, DTL2, and DTL3 may not be disposed to correspond to each area occupied by the first to third sub-pixels SPX1, SPX2, and SPX3, and may be disposed in a specific position within one pixel PX. In FIGS. 4-13, it is illustrated that the first to third data lines DTL1, DTL2, and DTL3 are disposed between the second sub-pixel SPX2 and the third sub-pixel SPX3 in one pixel PX, but is not limited thereto.

The initialization voltage wire VIL extends in the first direction DR1 and is disposed across the plurality of pixels PX arranged along the first direction DR1. The initialization voltage wire VIL is on the left side of the first data line DTL1 in a plan view and may be disposed between the lower metal layers CAS1, CAS2, and CAS3 and the first data line DTL1, but is not limited thereto. The initialization voltage wire VIL may be connected to a conductive pattern disposed on the other conductive layer to be connected to each of the sub-pixels SPXn. The initialization voltage wire VIL may be electrically connected to the drain electrode of the third transistor ('T3' in FIGS. 3 and 4) and may apply an initialization voltage to the third transistor T3.

The first voltage wire VL1 and the second voltage wire VL2 may be disposed to extend in the first direction DR1, and may each be disposed across the plurality of pixels PX arranged along the first direction DR1. The first voltage wire VL1 may be disposed between the second scan line SL2 and the plurality of lower metal layers CAS1, CAS2, and CAS3, and the second voltage wire VL2 may be disposed on the right side, which is one side in the second direction DR2, of the third data line DTL3. Each of the first voltage wire VL1 and the second voltage wire VL2 may be connected to the plurality of sub-pixels SPXn belonging to one pixel PX. The first voltage wire VL1 may be connected to the first electrode RME1 of each sub-pixel SPXn through a first transistor ('T1' in FIGS. 3 and 4), and the second voltage wire VL2 may be connected to the second electrode RME2 through the third voltage wire VL3 disposed on the other conductive layer. The first voltage wire VL1 and the second voltage wire VL2 may transmit the power voltage applied from the voltage wire pads WPD_VL1 and WPD_VL2 to the electrodes RME1 and RME2 disposed in each sub-pixel SPXn, respectively. The first voltage wire VL1 may be applied with a high potential voltage (or a first power voltage) transmitted to the first electrode RME1, and the second voltage wire VL2 may be applied with a low potential voltage (or a second power voltage) transmitted to the second electrode RME2.

The plurality of lower metal layers CAS1, CAS2, and CAS3 may be disposed between the first voltage wire VL1 and the initialization voltage wire VIL. Each of the lower metal layers CAS1, CAS2, and CAS3 is disposed to overlap a first active layer ACT1 of the semiconductor layer to be described later and a first capacitance electrode CSE1 of the second conductive layer. The first lower metal layer CAS1 is disposed to overlap the first active layer ACT1 of a first transistor T1_1 connected to the first sub-pixel SPX1 in a thickness direction of the substrate SUB. The second lower metal layer CAS2 is disposed to overlap the first active layer ACT1 of a first transistor T1_2 connected to the second sub-pixel SPX2 in the thickness direction of the substrate SUB, and the third lower metal layer CAS3 is disposed to overlap the first active layer ACT1 of a first transistor T1_3 connected to the third sub-pixel SPX3 in the thickness direction of the substrate SUB. The first to third lower metal layers CAS1, CAS2, and CAS3 may be spaced from each other in the first direction DR1, and may be disposed at the center (or a central region) of each pixel PX in a plan view. For example, the first lower metal layer CAS1 may be disposed on the upper side, which is one side in the first direction DR1, of the center of the pixel PX, the second lower metal layer CAS2 may be disposed on the lower side, which is the other side in the first direction DR1, of the center of the pixel PX, and the third lower metal layer CAS3 may be disposed between the first lower metal layer CAS1 and the second lower metal layer CAS2.

The lower metal layers CAS1, CAS2, and CAS3 may include a light blocking material to prevent light from entering the first active layer ACT1 of the first transistor T1. For example, the lower metal layers CAS1, CAS2, and CAS3 may be formed of an opaque metal material that blocks light transmission. However, the present disclosure is not limited thereto, and in some cases, the lower metal layers CAS1, CAS2, and CAS3 may be omitted, and may be disposed to overlap the active layers of the other transistors T1, T2, and T3.

A buffer layer BL may be disposed on the first conductive layer and the first substrate SUB. The buffer layer BL may be formed on the first substrate SUB to protect the transistors of the pixel PX from moisture permeating through the first substrate SUB susceptible to moisture permeation, and may perform a surface planarization function.

The semiconductor layer is disposed on the buffer layer BL. The semiconductor layer may include active layers ACT1, ACT2, and ACT3 of the transistors T1, T2, and T3, respectively.

The semiconductor layer may include polycrystalline silicon, monocrystalline silicon, oxide semiconductor, and the like. In another embodiment, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), or indium gallium zinc tin oxide (IGZTO).

The plurality of first active layers ACT1 of the first transistors T1_1, T1_2, and T1_3 connected to each of the sub-pixels SPX1, SPX2, and SPX3 may be disposed on the left side of the center (or the central region) of each pixel PX. The first active layers ACT1 may be disposed in an area generally occupied by the first sub-pixel SPX1. The first active layers ACT1 may be spaced from each other along the first direction DR1, and may partially overlap the lower metal layers CAS1, CAS2, and CAS3, the first capacitance electrode CSE1 of the second conductive layer, and a third conductive pattern DP3, and a second capacitance electrode CSE2 of the third conductive layer, in the thickness direction of the substrate SUB. For example, each first active layer ACT1 may include a first area overlapping the third conductive pattern DP3, a second area overlapping the first capacitance electrode CSE1, and a third area, which is a portion other than the first area and the second area, overlapping the second capacitance electrode CSE2, in the thickness direction of the substrate SUB.

The second active layers ACT2 of second transistors T2_1, T2_2, and T2_3 connected to each of the sub-pixels SPX1, SPX2, and SPX3 may be disposed adjacent to the center (or the central region) of each pixel PX. The second active layer ACT2 may be disposed in an area generally occupied by the second sub-pixel SPX2. The second active layers ACT2 may be spaced from each other along the first direction DR1, and may be disposed to partially overlap a third gate pattern GP3 of the second conductive layer, and a fourth conductive pattern DP4 and a fifth conductive pattern DP5 of the third conductive layer in the thickness direction of the substrate SUB. For example, the second active layer ACT2 may include a first area overlapping the fourth conductive pattern DP4, a second area overlapping the third gate pattern GP3, and a third area, which is a portion other than the first area and the second area, overlapping the fifth conductive pattern DP5. The first area of the second active layer ACT2 may be in contact with the fourth conductive pattern DP4, and the third area of the second active layer ACT2 may be in contact with the fifth conductive pattern DP5.

The second active layers ACT2 of the second transistors T2 may have lengths different from each other according to the disposition of the data lines DTL1, DTL2, and DTL3. For example, the first data line DTL1, the second data line DTL2, and the third data line DTL3 may be sequentially disposed in the second direction DR2 from the areas in which the second active layers ACT2 are disposed. The second active layer ACT2 of the second transistor T2_1 connected to the first sub-pixel SPX1 may have the shortest length measured in the second direction DR2 as the first data line DTL1 is adjacently disposed, and the second active layer ACT2 of the third transistor T2_3 connected to the third sub-pixel SPX3 may have the longest length measured in the second direction DR2 as the third data line DTL3 is disposed to be spaced apart the most. However, the relationship between the lengths of the second active layers ACT2 may vary according to the disposition of the sub-pixels SPXn and the disposition of the data lines DTL.

The third active layers ACT3 of the third transistors T3_1, T3_2, and T3_3 connected to each of the sub-pixels SPX1, SPX2, and SPX3 may also be disposed at the center of the pixel PX. The third active layers ACT3 may also be disposed in an area occupied by the second sub-pixel SPX3. The third active layers ACT3 may be spaced from each other along the first direction DR1, and may be disposed side by side with the second active layers ACT2 in the first direction DR1. The third active layers ACT3 may be disposed to partially overlap the third gate pattern GP3 of the second conductive layer, and a sixth conductive pattern DP6 and the second capacitance electrodes CSE2 of the third conductive layer in the thickness direction of the substrate SUB (see, for example, FIG. 11). For example, the third active layer ACT3 may include a first area overlapping the sixth conductive pattern DP6, a second area overlapping the third gate pattern GP3, and a third area, which is a portion other than the first area and the second area, overlapping the second capacitance electrode CSE2. The first area of the third active layer ACT3 may be in contact with the sixth conductive pattern DP6, and the third area may be in contact with the second capacitance electrode CSE2.

In some embodiments, the third active layer ACT3 of the third transistors T3_2 and T3_3 connected to the second sub-pixel SPX2 and the third sub-pixel SPX3 is such that the first areas, which overlap the sixth conductive pattern DP6 in the thickness direction of the substrate SUB, may be integrated with each other (see, for example, FIGS. 4 and 5). Because the third transistors T3 of each of the sub-pixels SPXn may be turned on at the same time, the third active layers ACT3 of transistors different from each other may be partially integrated with each other.

The first gate insulating layer GI is disposed on the semiconductor layer and the buffer layer BL. The first gate insulating layer GI may serve as a gate insulating layer of the first transistor T1.

The second conductive layer is disposed on the first gate insulating layer GI. The second conductive layer may include a plurality of gate patterns GP1, GP2, and GP3, and the first capacitance electrode CSE1.

The first gate pattern GP1 and the second gate pattern GP2 may have a shape extending in the first direction DR1 and may be disposed on the left side of each pixel PX. The first gate pattern GP1 and the second gate pattern GP2 may be disposed to overlap the first scan line SL1 and the second scan line SL2, respectively, in the thickness direction of the substrate SUB. The first gate pattern GP1 may be directly connected to the first scan line SL1 through an eleventh contact hole CNT11 penetrating the buffer layer BL and the first gate insulating layer GI, and the second gate pattern GP2 may be directly connected to the second scan line SL2 through the eleventh contact hole CNT11 penetrating the buffer layer BL and the first gate insulating layer GI. Each of the first gate pattern GP1 and the second gate pattern GP2 may prevent the intensity of the scan signal applied from the pad area PDA through the first scan line SL1 and the second scan line SL2, from being lowered depending on the position of the display area DPA.

The third gate pattern GP3 may have a shape extending in the first direction DR1 and may be disposed at the center (or the central region) of each pixel PX. The third gate pattern GP3 may extend from the upper side of the pixel PX in the first direction DR1 to overlap the plurality of second active layers ACT2 and third active layers ACT3 in the thickness direction of the substrate SUB. For example, the third gate pattern GP3 may overlap the second area of the second active layers ACT2 and the second area of the third active layers ACT3. The third gate pattern GP3 may serve as a second gate electrode G2 of the second transistor T2 and a third gate electrode G3 of the third transistor T3. As will be described later, the third gate pattern GP3 may be connected to the first scan line SL1 or the second scan line SL2 through the third scan line SL3 (e.g., see, for example, FIG. 6), and the scan signal may be transferred to the second transistor T2 and the third transistor T3 through the third gate pattern GP3.

The plurality of first capacitance electrodes CSE1 may be spaced from each other along the first direction DR1 and may be disposed between the second gate pattern GP2 and the third gate pattern GP3. Each of the first capacitance electrodes CSE1 may partially overlap the lower metal layers CAS1, CAS2, and CAS3, the first active layer ACT1, and the second capacitance electrode CSE2 of the third conductive layer, in the thickness direction of the substrate SUB. For example, each of the first capacitance electrodes CSE1 may partially overlap the second area of the first active layer ACT1 and serve as the first gate electrode G1 of the first transistor T1 (see, for example, FIG. 9). The first capacitance electrode CSE1 may be connected to the fourth conductive pattern DP4 as described later, and may transfer a data signal applied through the second transistor T2 to the first gate electrode G1 of the first transistor T1. In addition, the first capacitance electrode CSE1 may overlap the second capacitance electrode CSE2, in the thickness direction of the substrate SUB, to constitute the storage capacitor Cst.

A first interlayer insulating layer IL1 is disposed on the second conductive layer. The first interlayer insulating layer IL1 may function as an insulating layer between the second conductive layer and other layers disposed thereon, and may protect the second conductive layer.

A third conductive layer is disposed on the first interlayer insulating layer IL1. The third conductive layer may include a third scan line SL3, the third voltage wire VL3, and a plurality of conductive patterns DP1, DP2, DP3, DP4, DP5, and DP6.

The third scan line SL3 extends in the second direction DR2 and is disposed over the plurality of pixels PX arranged along the second direction DR2. The third scan line SL3 may be disposed on the upper side of each pixel PX in a plan view and may be disposed across the non-emission area of each sub-pixel SPXn. The third scan line SL3 may be connected to the first scan line SL1 or the second scan line SL2 of the first conductive layer. The third scan line SL3 may be connected to the first scan line SL1 or the second scan line SL2 through a ninth contact hole CNT9 penetrating through the buffer layer BL, the first gate insulating layer GI, and the first interlayer insulating layer IL1.

The third scan line SL3 may be connected to any one of the first scan line SL1 or the second scan line SL2 disposed on any one pixel PX (see, for example, FIG. 6). For example, when the third scan line SL3 is connected to the first scan line SL1 disposed in one pixel PX, the corresponding third scan line SL3 may not be connected to the other second scan lines SL2 disposed in the same row as the corresponding pixel PX. The corresponding third scan line SL3 and another third scan line SL3 that are spaced from each other in the first direction DR1 may be connected to the other scan lines SL1 and SL2 except for the first scan line SL1 disposed in the one pixel PX. A description of the connection relationship between the plurality of scan lines SL1, SL2, and SL3 will be described later with reference to other drawings.

In addition, the third scan line SL3 may be connected to the third gate pattern GP3 of the second conductive layer and may be connected to the second transistor T2 and the third transistor T3. The third scan line SL3 may be connected to the third gate pattern GP3 through a tenth contact hole CNT10 penetrating the first interlayer insulating layer IL1. One third scan line SL3 may be connected to each of the third gate patterns GP3 disposed on the pixels PX in the same row. The third scan line SL3 may transmit a scan signal to the gate electrode of the second transistor T2 and the third transistor T3 through the first scan line SL1 or the second scan line SL2 and the third gate pattern GP3.

The third voltage wire VL3 extends in the second direction DR2 and is disposed over the plurality of pixels PX arranged along the second direction DR2. The third voltage wire VL3 may be disposed on the lower side of each pixel PX in a plan view and may be disposed across the non-emission area of each sub-pixel SPXn. According to one embodiment, the third voltage wire VL3 may be connected to any one of the first voltage wire VL1 and the second voltage wire VL2. The plurality of third voltage wires VL3 may be spaced from each other along the first direction DR1, and among them, the wire connected to the first voltage wire VL1 and the wire connected to the second voltage wire VL2 may be alternately disposed.

For example, as illustrated in FIGS. 4-13, when the third voltage wire VL3 disposed in the pixels PX of a certain pixel row is connected to the second voltage wire VL2, the third voltage wire VL3 of pixel rows adjacent to the pixel row in the first direction DR1 may be connected to the first voltage wire VL1. In the pixel row in which the second voltage wire VL2 and the third voltage wire VL3 are connected, the third voltage wire VL3 may be connected to the second voltage wire VL2 through a thirteenth contact hole CNT13 penetrating the buffer layer BL, the first gate insulating layer GI, and the first interlayer insulating layer IL1 in a portion thereof overlapping the second voltage wire VL2. In this case, the third voltage wire VL3 may be spaced from the third conductive pattern DP3. In the pixel row in which the first voltage wire VL1 and the third voltage wire VL3 are connected, the third voltage wire VL3 may be connected to the third conductive pattern DP3 of the third conductive layer. As an example, the third voltage wire VL3 and the third conductive pattern DP3 may be integrally connected to each other, and the third voltage wire VL3 may be connected to the first voltage wire VL1 through the third conductive pattern DP3.

The plurality of voltage wires VL1, VL2, and VL3 may extend in the first direction DR1 and the second direction DR2 to be disposed in a mesh structure in the entire surface of the display area DPA. The first voltage wire VL1 and the second voltage wire VL2 may be formed of a first conductive layer and extend in the first direction DR1 to be disposed for each pixel PX, and the third voltage wire VL3 may be formed of the third conductive layer and extend in the second direction DR2 to be disposed in the pixels PXs in rows different from each other, and thus the wires may be disposed in a mesh shape in the entire surface of the display area DPA.

In addition, the plurality of pixel rows may be distinguished from each other according to whether the third voltage wire VL3 is connected to the first voltage wire VL1 or the second voltage wire VL2. Although the third voltage wire VL3 is alternately disposed on different types of wires according to the connection with the other voltage wires VL1 and VL2, the voltage wires VL may be connected to all pixels PX of the display area DPA according to the connection of the first voltage wire VL1 and the second voltage wire VL2. Accordingly, the number of wires disposed in the display area DPA may be further reduced, and in a large-area display device, there is an effect of preventing an IR drop of a voltage applied through the voltage wire. A description of the disposition and connection of the plurality of voltage wires VL1, VL2, and VL3 will be described later with reference to other drawings.

The second capacitance electrodes CSE2 may be spaced from each other along the second direction DR2 to be disposed to overlap the first capacitance electrode CSE1 and the lower metal layers CAS1, CAS2, and CAS3 in the thickness direction of the substrate SUB. The second capacitance electrode CSE2 is spaced from the first capacitance electrode CSE1 with the first interlayer insulating layer IL1 interposed therebetween, and the storage capacitor Cst may be formed therebetween. Among the second capacitance electrodes CSE2, the second capacitance electrode CSE2 disposed on the upper side of the pixel PX may form the storage capacitor Cst of the first sub-pixel SPX1, the second capacitance electrode CSE2 disposed on the lower side of the pixel PX may form the storage capacitor Cst of the second sub-pixel SPX2, and the second capacitance electrode CSE2 disposed on the center (or the central region) of the pixel PX may form the storage capacitor Cst of the third sub-pixel SPX3.

The second capacitance electrode CSE2 may be disposed so that a portion thereof overlaps the first active layer ACT1 and the third active layer ACT3 in the thickness direction of the substrate SUB. Each second capacitance electrode CSE2 may be connected to the first active layer ACT1 through a second contact hole CNT2 penetrating the first gate insulating layer GI and the first interlayer insulating layer IL1 in a portion overlapping the first active layer ACT1, and may serve as a first source electrode S1 of the first transistor T1. In addition, the second capacitance electrode CSE2 may also be connected to the lower metal layers CAS1, CAS2, and CAS3 through a fourth contact hole CNT4 penetrating the buffer layer BL, the first gate insulating layer GI, and the first interlayer insulating layer IL1. In addition, each second capacitance electrode CSE2 may be connected to the third active layer ACT3 through an eighth contact hole CNT8 penetrating the first gate insulating layer GI and the first interlayer insulating layer IL1 in a portion overlapping the third active layer ACT3 in the thickness direction of the substrate SUB, and may serve as a third source electrode S3 of the third transistor T3 (see, for example, FIG. 11).

Each of the second capacitance electrodes CSE2 may be connected to the first electrode RME1 disposed on a via layer VIA, which will be described later. Each of the second capacitance electrodes CSE2 forming the storage capacitor Cst of the first sub-pixel SPX1 and the second sub-pixel SPX2 may be disposed to overlap the first electrode RME1 of the corresponding sub-pixel SPXn in a third direction DR3 which is a thickness direction of the substrate SUB, and may be connected to each other through a first electrode contact hole CTD in a portion overlapping each other (see, for example, FIG. 13). However, the second capacitance electrode CSE2 connected to the first electrode RME1 of the third sub-pixel SPX3 does not overlap the corresponding first electrode RME1 in the thickness direction (e.g., the third direction DR3). The third conductive layer may include an electrode connection portion CET connected to any one of the second capacitance electrodes CSE2, and the first electrode RME1 disposed in the third sub-pixel SPX3 may be connected to the second capacitance electrode CSE2 through the electrode connection portion CET.

The first conductive pattern DP1 and the second conductive pattern DP2 may have a shape extending in the first direction DR1 and may be disposed on the left side of each pixel PX. The first conductive pattern DP1 may be disposed to overlap the first scan line SL1 and the first gate pattern GP1 in the thickness direction of the substrate SUB, and the second conductive pattern DP2 may be disposed to overlap the second scan line SL2 and the second gate pattern GP2 in the thickness direction of the substrate SUB. The first conductive pattern DP1 may be directly connected to the first scan line SL1 through a twelfth contact hole CNT12 penetrating the buffer layer BL, the first gate insulating layer GI, and the first interlayer insulating layer IL1, and the second conductive pattern DP2 may be directly connected to the second scan line SL2 through the twelfth contact hole CNT12 penetrating the buffer layer BL, the first gate insulating layer GI, and the first interlayer insulating layer IL1.

The third conductive pattern DP3 may have a shape extending in the first direction DR1 and may be disposed between the second conductive pattern DP2 and the second capacitance electrodes CSE2. The third conductive pattern DP3 may partially overlap the first voltage wire VL1 and the first active layer ACT1, and may be connected to each of them. The third conductive pattern DP3 may be in contact with the first voltage wire VL1 through the third contact hole CNT3 penetrating the buffer layer BL, the first gate insulating layer GI, and the first interlayer insulating layer IL1, and may be in contact with the first active layer ACT1 through the first contact hole CNT1 penetrating the first gate insulating layer GI and the first interlayer insulating layer IL1, respectively (see, for example, FIG. 9). The third conductive pattern DP3 may serve as a first drain electrode D1 of the first transistor T1. In addition, as described above, the third conductive pattern DP3 may be connected to the third voltage wire VL3, or may be disposed to be spaced therefrom.

The fourth conductive patterns DP4 may disposed to overlap any one of the second active layer ACT2 and the data lines DTL, and the fifth conductive patterns DP5 may be disposed to overlap the second active layer ACT2 and the first capacitance electrode CSE1. The fourth conductive patterns DP4 may be in contact with the data line DTL through the fifth contact hole CNT5 penetrating the buffer layer BL, the first gate insulating layer GI, and the first interlayer insulating layer IL1, and may be in contact with the second active layer ACT2 through the fifth contact hole CNT5 penetrating the first gate insulating layer GI and the first interlayer insulating layer IL1. The fourth conductive pattern DP4 may serve as the second drain electrode D2 of the second transistor T2. The fifth conductive patterns DP5 may be in contact with the first capacitance electrode CSE1 through a sixth contact hole CNT6 penetrating the first interlayer insulating layer IL1, and may be in contact with the second active layer ACT2 through the sixth contact hole CNT6 penetrating the first gate insulating layer GI and the first interlayer insulating layer IL1. The fifth conductive pattern DP5 may serve as a second source electrode S2 of the second transistor T2.

The sixth conductive patterns DP6 may be disposed to overlap the initialization voltage wire VIL and the third active layer ACT3. The sixth conductive patterns DP6 may be in contact with the initialization voltage wire VIL through the seventh contact hole CNT7 penetrating the buffer layer BL, the first gate insulating layer GI, and the first interlayer insulating layer IL1, and may be in contact with the third active layer ACT3 through the seventh contact hole CNT7 penetrating the first gate insulating layer GI and the first interlayer insulating layer IL1. The sixth conductive pattern DP6 may serve as a third drain electrode D3 of the third transistor T3.

In some embodiments, in FIGS. 4-13, it is illustrated that the conductive layer below the via layer VIA is formed of the first to third conductive layers, but is not limited thereto. In some embodiments, the display device 10 may further include a fourth conductive layer disposed between the third conductive layer and the via layer VIA, and the fourth conductive layer may include several conductive patterns.

The buffer layer BL, the first gate insulating layer GI, and the first interlayer insulating layer IL1 described above may be formed of a plurality of inorganic layers stacked in an alternating manner. For example, the buffer layer BL, the first gate insulating layer GI, and the first interlayer insulating layer IL1 may be formed as a double layer formed by stacking, or a multilayer formed by alternately stacking, inorganic layers including at least one of silicon oxide (SiOx), silicon nitride (SiNx), or silicon oxynitride (SiOxNy). However, the disclosure is not limited thereto, and the buffer layer BL, the first gate insulating layer GI, and the first interlayer insulating layer IL1 may be formed as a single inorganic layer containing the above-described insulating material. In addition, in some embodiments, the first interlayer insulating layer IL1 may be made of an organic insulating material such as polyimide (PI).

The second conductive layer and the third conductive layer may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof. However, the disclosure is not limited thereto.

The via layer VIA is disposed on the third conductive layer. The via layer VIA may include an organic insulating material, for example, an organic insulating material such as polyimide (PI), to perform a surface planarization function.

On the via layer VIA, as a display element layer, a plurality of electrodes RME1, RME2, and RME3, a plurality of protruding patterns BP1 and BP2, the bank BNL, a plurality of light emitting elements ED, and a plurality of connection electrodes CNE1, CNE2, and CNE3 are disposed. Further, a plurality of insulating layers PAS1, PAS2, and PAS3 may be disposed on the via layer VIA.

The protruding patterns BP may be directly disposed on the via layer VIA. The protruding patterns BP may have a suitable width (e.g., a predetermined width) in the second direction DR2 and may have a shape extending in the first direction DR1. The protruding patterns BP may be disposed over the emission areas EMA of the sub-pixels SPXn different from each other, or may be disposed in the emission areas EMA. For example, the protruding patterns BP may include a first protruding pattern BP1 disposed over the emission areas EMA of the sub-pixels SPXn different from each other, and a second protruding pattern BP2 disposed between the first protruding patterns BP1 in the emission area EMA of each sub-pixel SPXn.

The first protruding pattern BP1 and the second protruding pattern BP2 may be spaced from each other in the second direction DR2 in the emission area EMA. The second protruding pattern BP2 is disposed in the center (or the central region) of the emission areas EMA, and the first protruding patterns BP1 are spaced from the second protruding pattern BP2 interposed therebetween. The first protruding pattern BP1 and the second protruding pattern BP2 may be alternately disposed along the second direction DR2. The light emitting elements ED may be disposed between the first protruding pattern BP1 and the second protruding pattern BP2 that are spaced from each other.

The first protruding pattern BP1 and the second protruding pattern BP2 may have the same length in the first direction DR1, but may have different widths measured in the second direction DR2. In the bank BNL to be described later, a portion extending in the first direction DR1 may overlap the first protruding pattern BP1 in the thickness direction of the substrate SUB. The protruding patterns BP may be disposed in an island-like pattern on the entire surface of the display area DPA.

The protruding patterns BP may have a structure in which at least a portion thereof protrudes from the top surface of the via layer VIA. The protruding portion of the protruding pattern BP may have an inclined or curved side surface. Unlike the illustration in the drawings, the protruding pattern BP may have a shape of a semi-circle or semi-ellipse whose outer surface is curved in a cross-sectional view. The protruding pattern BP may include an organic insulating material such as polyimide (PI), but is not limited thereto.

The plurality of electrodes RME have a shape extending in one direction and are disposed for each sub-pixel SPXn. The plurality of electrodes RME may extend in the first direction DR1 to be disposed across the emission area EMA of the sub-pixel SPXn and the sub-region SA, and may be spaced from each other in the second direction DR2. The display device 10 includes the first electrode RME1, the second electrode RME2, and the third electrode RME3 disposed in each sub-pixel SPXn. The first electrode RME1 is disposed at the center of the emission area EMA, the second electrode RME2 is disposed on the left side of the first electrode RME1, and the third electrode RME3 is disposed on the right side of the first electrode RME1.

The first electrode RME1 may be disposed on the second protruding pattern BP2, and each portion of the second electrode RME2 and the third electrode RME3 may be disposed on the first protruding patterns BP1 different from each other. Each of the electrodes RME may be disposed on at least an inclined side surface of each of the protruding patterns BP1 and BP2. The first electrode RME1 may have a larger width in the second direction DR2 than the second protruding pattern BP2, and the second electrode RME2 and the third electrode RME3 may have a smaller width in the second direction DR2 than the first protruding pattern BP1. Each of the electrodes RME may be disposed to cover at least one side surface of the protruding patterns BP to reflect light emitted from the light emitting element ED. In addition, an interval between the plurality of electrodes RME in the second direction DR2 may be narrower than an interval between the protruding patterns BP1 and BP2. Each of the electrodes RME may have at least a portion directly disposed on the via layer VIA, so that they may be disposed at the same plane.

The first electrode RME1 and the third electrode RME3 may extend in the first direction DR1, but may be spaced from the first electrode RME1 and the third electrode RME3 of the other adjacent sub-pixel SPXn in the first direction DR1 in the sub-region SA of each sub-pixel SPXn. On the other hand, the second electrode RME2 may extend in the first direction DR1 and may be disposed in the plurality of sub-pixels SPXn arranged in the first direction DR1.

The first electrode RME1 may be connected to the third conductive layer through the first electrode contact hole CTD formed in a portion overlapping the bank BNL. The first electrode RME1 of the first sub-pixel SPX1 may be in contact with the second capacitance electrode CSE2 through the first electrode contact hole CTD penetrating the via layer VIA (see, for example, FIG. 10) in a portion overlapping the bank BNL positioned on the upper side of the emission area EMA. The first electrode RME1 of the second sub-pixel SPX2 and the third sub-pixel SPX3 may be connected to the third conductive layer through the first electrode contact hole CTD penetrating the via layer VIA in a portion overlapping the bank BNL positioned on the upper side of the emission area EMA. The first electrode RME1 of the second sub-pixel SPX2 may be connected to any one of the second capacitance electrodes CSE2, and the first electrode RME1 of the third sub-pixel SPX3 may be connected to the electrode connection portion CET.

The second electrode RME2 may be connected to the third voltage wire VL3 through the second electrode contact hole CTS penetrating the via layer VIA in the sub-region SA positioned on the lower side of the emission areas EMA (see, for example, FIG. 10). The third voltage wire VL3 connected to the second electrode RME2 may be a voltage wire connected to the second voltage wire VL2. That is, among the plurality of pixels PX or sub-pixels SPXn that are arranged along the first direction DR1, the second electrode RME2 may be connected to the third voltage wire VL3 through the second electrode contact hole CTS in the pixels PX belonging to some pixel rows, but the second electrode RME2 may not be connected to the third voltage wire VL3 in the pixels PX belonging to the other pixel row. In a pixel row in which the second electrode RME2 is not connected to the third voltage wire VL3, the third voltage wire VL3 may be connected to the first voltage wire VL1.

The plurality of electrodes RME may be electrically connected to some of the light emitting elements ED. Each of the electrodes RME may be connected to the light emitting element ED through the connection electrodes CNE1, CNE2, and CNE3 to be described later, and may transmit an electrical signal applied from the lower conductive layer to the light emitting element ED.

The first insulating layer PAS1 is disposed on the via layer VIA, the protruding patterns BP, and the plurality of electrodes RME. The first insulating layer PAS1 may be disposed on the via layer VIA to cover the plurality of electrodes RME and the protruding patterns BP. The first insulating layer PAS1 may not be disposed in a portion in which the electrodes RME adjacent in the first direction DR1 in the sub-region SA are spaced from each other. The first insulating layer PAS1 may protect the plurality of electrodes RME and insulate electrodes RME that are different from each other. In addition, the first insulating layer PAS1 may prevent the light emitting element ED disposed thereon from being damaged by direct contact with the electrode RME.

In an embodiment, the first insulating layer PAS1 may have stepped portions such that the top surface thereof is partially depressed between the electrodes RME that are spaced in the second direction DR2. The light emitting element ED may be disposed on the top surface of the first insulating layer PAS1, where the stepped portions are formed, and thus a space may remain between the light emitting element ED and the first insulating layer PAS1.

The first insulating layer PAS1 may include a plurality of contact portions CT1, CT2, and CT3 that expose a part of the top surface of each electrode RME (see, for example, FIG. 12). The contact portions CT1, CT2, and CT3 may penetrate the first insulating layer PAS1, and the connection electrodes CNE, which will be described later, may be in contact with the exposed electrodes RME through the contact portions CT1, CT2, and CT3.

The bank BNL may be disposed on the first insulating layer PAS1. The bank BNL may include portions extending in the first direction DR1 and the second direction DR2 in a plan view, and thus may be arranged in a grid pattern. The bank BNL may be disposed along the boundaries between the sub-pixels SPXn to delimit the neighboring sub-pixels SPXn. In addition, the bank BNL may be disposed to surround the emission area EMA and the sub-region SA, and areas partitioned and opened by the bank BNL may be the emission area EMA and the sub-region SA, respectively.

The bank BNL may have a certain height, and in some embodiments, the bank BNL may have a height of the top surface thereof higher than the protruding patterns BP, and the thickness thereof may be equal to or greater than the protruding pattern BP. The bank BNL may prevent ink from overflowing to the adjacent sub-pixel SPXn in an inkjet printing step during the fabricating process of the display device 10. The bank BNL may prevent inks where the different light emitting elements ED are dispersed in the different sub-pixels SPXn from being mixed with each other. The bank BNL may include polyimide like the protruding pattern BP, but is not limited thereto.

The plurality of light emitting element ED may be disposed on the first insulating layer PAS1. The light emitting element ED may include a plurality of layers arranged in a direction parallel to the top surface of the first substrate SUB. The light emitting element ED of the display device 10 may be disposed such that one extension direction thereof is parallel to the first substrate SUB, and the plurality of semiconductor layers included in the light emitting element ED may be sequentially arranged in a direction parallel to the top surface of the first substrate SUB. However, the disclosure is not limited thereto. In some cases, when the light emitting element ED has a different structure, the plurality of layers may be arranged in a direction perpendicular to the first substrate SUB.

The plurality of light emitting elements ED may be disposed on the electrodes RME that are spaced from each other along the second direction DR2 between the protruding patterns BP1 and BP2 that are different from each other. The light emitting elements ED may be spaced from each other along the first direction DR1 and may be substantially aligned in parallel with each other. The light emitting element ED may have a shape extending in one direction, and an extended length may be longer than the shortest distance between the electrodes RME that are spaced from each other along the second direction DR2. The light emitting elements ED may have at least one end disposed on any one of the electrodes RME that are different from each other, or may have both ends disposed on the electrodes RME that are different from each other, respectively. A direction in which each electrode RME is extended and a direction in which the light emitting element ED is extended may be disposed to be substantially perpendicular. However, the disclosure is not limited thereto, and the light emitting elements ED may each be arranged to extend in a direction oblique to the extension direction of the electrodes RME.

The light emitting element ED may include a first light emitting element ED1 whose both ends are respectively disposed on the first electrode RME1 and the third electrode RME3, and a second light emitting element ED2 whose both ends are respectively disposed on the first electrode RME1 and the second electrode RME2. The first light emitting elements ED1 may be disposed on the right side with respect to the first electrode RME1, and the second light emitting elements ED2 may be disposed on the left side with respect to the first electrode RME1.

The light emitting elements ED disposed in each sub-pixel SPXn may include a plurality of semiconductor layers to emit light of a specific wavelength band. The light emitting elements ED may have a first end and a second end opposite to the first end based on any one semiconductor layer. For example, in the first light emitting element ED1, a portion disposed on the first electrode RME1 may be the first end, and a portion disposed on the third electrode RME3 may be the second end. Also in the second light emitting element ED2, a portion disposed on the first electrode RME1 may be a first end, and a portion disposed on the second electrode RME2 may be a second end. In both the first light emitting element ED1 and the second light emitting element ED2, the first end may be disposed on the first electrode RME1, and the directions toward which the first ends face may be opposite directions. However, some of the first light emitting element ED1 and the second light emitting element ED2 may be disposed so that the first ends face in the same direction.

The light emitting elements ED may be in contact with the connection electrodes CNE1, CNE2, and CNE3 to be electrically connected to the electrode RME and other light emitting elements ED. In the light emitting element ED, a portion of the semiconductor layer is exposed on an extended end surface on one direction side, and the exposed semiconductor layer may be in contact with the connection electrode CNE. Each of the light emitting elements ED may be electrically connected to the conductive layers under the electrode RME and the via layer VIA through the connection electrodes CNE, and may emit light of a specific wavelength band by being applied with an electrical signal.

The second insulating layer PAS2 may be disposed in the plurality of light emitting elements ED, the bank BNL, and the sub-region SA. The second insulating layer PAS2 extends in the first direction DR1 and includes a pattern portion disposed on the plurality of light emitting elements ED. The pattern portion may be disposed between the first protruding pattern BP1 and the second protruding pattern BP2 to partially surround the outer surface of the light emitting element ED, and may not cover both sides or both ends of the light emitting element ED. The pattern portion may form a linear or island-like pattern in each sub-pixel SPXn in a plan view. The pattern portion of the second insulating layer PAS2 may protect the light emitting element ED and fix the light emitting elements ED during a manufacturing process of the display device 10. Further, the second insulating layer PAS2 may be disposed to fill the space between the light emitting element ED and the first insulating layer PAS1 thereunder.

The plurality of connection electrodes CNE1, CNE2, and CNE3 may be disposed on the plurality of electrodes RME and the light emitting elements ED, and may be in contact with each of them. For example, the connection electrode CNE may be in contact with at least one of the electrodes RME through the contact portions CT1, CT2, and CT3 penetrating the first insulating layer PAS1 and may also be in contact with one end of the light emitting element ED.

The first connection electrode CNE1 may have a shape extending in the first direction DR1 and may be disposed on the first electrode RME1. A portion of the first connection electrode CNE1 disposed on the second protruding pattern BP2 may overlap the first electrode RME1, extend in the first direction DR1 therefrom to cross the bank BNL, and be disposed up to the sub-region SA positioned on the lower side of the emission area EMA. The first connection electrode CNE1 may be in contact with the first electrode RME1 through the first contact portion CT1 exposing the top surface of the first electrode RME1 in the sub-region SA. The first connection electrode CNE1 may be in contact with the first ends of the first light emitting elements ED1 and the first electrode RME1 to transmit an electrical signal applied from the first transistor T1 to the light emitting element ED.

The second connection electrode CNE2 may have a shape extending in the first direction DR1 and may be disposed on the second electrode RME2. A portion of the second connection electrode CNE2 disposed on the first protruding pattern BP1 may overlap the second electrode RME2, extend in the first direction DR1 therefrom to cross the bank BNL, and may be disposed up to the sub-region SA positioned on the lower side of the emission area EMA. The second connection electrode CNE2 may be in contact with the second electrode RME2 through the second contact portion CT2 exposing the top surface of the second electrode RME2 in the sub-region SA. The second connection electrode CNE2 may be in contact with the second ends of the second light emitting elements ED2 and the second electrode RME2 to transmit an electrical signal applied from the second voltage wire VL2 to the light emitting element ED.

The third connection electrode CNE3 may include extension portions CN_E1 and CN_E2 extending in the first direction DR1 and a first connection portion CN_B1 connecting the extension portions CN_E1 and CN_E2. The first extension portion CN_E1 may be disposed on the third electrode RME3 and may be disposed to extend from the emission area EMA to the sub-region SA positioned on the upper side. The second extension portion CN_E2 may be disposed on the first electrode RME1 in the emission area EMA, and the first connection portion CN_B1 may extend in the second direction DR2 in the emission area EMA to connect the first extension portion CN_E1 to the second extension portion CN_E2. The first extension portion CN_E1 of the third connection electrode CNE3 may be in contact with the third electrode RME3 through the third contact portion CT3 exposing the top surface of the third electrode RME3 in the sub-region SA. The third connection electrode CNE3 may be in contact with the second end of the first light emitting element ED1 and the first end of the second light emitting element ED2 to electrically connect the first light emitting element ED1 to the second light emitting element ED2. The first light emitting element ED1 and the second light emitting element ED2 may be connected in series through the third connection electrode CNE3.

The third insulating layer PAS3 is disposed on the third connection electrode CNE3 and the second insulating layer PAS2. The third insulating layer PAS3 may be entirely disposed on the second insulating layer PAS2 and may be disposed to cover the third connection electrode CNE3, and the first connection electrode CNE1 and the second connection electrode CNE2 may be disposed on the third insulating layer PAS3. The third insulating layer PAS3 may be entirely disposed on the via layer VIA except for an area in which the first connection electrode CNE1 and the second connection electrode CNE2 are disposed. That is, the third insulating layer PAS3 may also be disposed on the protruding pattern BP and the bank BNL in addition to the first insulating layer PAS1 and the second insulating layer PAS2. The third insulating layer PAS3 may insulate the first connection electrode CNE1 and the second connection electrode CNE2 from each other and from the third connection electrode CNE3 so that they are not directly in contact with the third connection electrode CNE3.

In some embodiments, the third insulating layer PAS3 may be omitted in the display device 10. Accordingly, the plurality of connection electrodes CNE may each be directly disposed on the second insulating layer PAS2, and may be disposed at same or substantially the same layer.

Although not illustrated in the drawings, the other insulating layer may be further disposed on the third insulating layer PAS3 and the plurality of connection electrodes CNE. The insulating layer may function to protect members disposed on the first substrate SUB from an external environment.

The first insulating layer PAS1, the second insulating layer PAS2, and the third insulating layer PAS3 described above may include an inorganic insulating material or an organic insulating material. However, the disclosure is not limited thereto.

FIG. 14 is a schematic diagram of a light emitting element according to one embodiment.

Referring to FIG. 14, the light emitting element ED may be a light emitting diode. For example, the light emitting element ED may be an inorganic light emitting diode that has a nanometer or micrometer size, and is made of an inorganic material. The light emitting element ED may be aligned between two electrodes having polarity when an electric field is formed in a specific direction between two electrodes opposing each other.

The light emitting element ED according to one embodiment may have a shape elongated in one direction. The light emitting element ED may have a shape of a cylinder, a rod, a wire, a tube, or the like. However, the shape of the light emitting element ED is not limited thereto, and the light emitting element ED may have a polygonal prism shape such as a regular cube, a rectangular parallelepiped, and a hexagonal prism, or may have various shapes such as a shape elongated in one direction and having an outer surface partially inclined.

The light emitting element ED may include a semiconductor layer doped with any conductivity type (e.g., p-type or n-type) impurities. The semiconductor layer may emit light of a specific wavelength band by receiving an electrical signal applied from an external power source. The light emitting element ED may include a first semiconductor layer 31, a second semiconductor layer 32, a light emitting layer 33, an electrode layer 37 and an insulating layer 38.

The first semiconductor layer 31 may be an n-type semiconductor. The first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer 31 may be any one or more of n-type doped AlGaInN, GaN, AlGaN, InGaN, AlN and InN. The n-type dopant doped into the first semiconductor layer 31 may be Si, Ge, Sn, or the like.

The second semiconductor layer 32 is disposed on the first semiconductor layer 31 with the light emitting layer 33 located therebetween. The second semiconductor layer 32 may be a p-type semiconductor, and the second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 32 may be any one or more of n-type doped AlGaInN, GaN, AlGaN, InGaN, AlN and InN. The p-type dopant doped into the second semiconductor layer 32 may be Mg, Zn, Ca, Se, Ba, or the like.

In some embodiments, although it is illustrated in FIG. 14 that each of the first semiconductor layer 31 and the second semiconductor layer 32 is configured as one layer, the disclosure is not limited thereto. Depending on the material of the light emitting layer 33, the first semiconductor layer 31 and the second semiconductor layer 32 may further include a larger number of layers, such as a cladding layer or a tensile strain barrier reducing (TSBR) layer.

The light emitting layer 33 is disposed between the first semiconductor layer 31 and the second semiconductor layer 32. The light emitting layer 33 may include a material having a single or multiple quantum well structure. When the light emitting layer 33 includes a material having a multiple quantum well structure, a plurality of quantum layers and well layers may be stacked alternately. The light emitting layer 33 may emit light by coupling of electron-hole pairs according to an electrical signal applied through the first semiconductor layer 31 and the second semiconductor layer 32. The light emitting layer 33 may include a material such as AlGaN or AlGaInN. For example, when the light emitting layer 33 has a structure in which quantum layers and well layers are alternately stacked in a multiple quantum well structure, the quantum layer may include a material such as AlGaN or AlGaInN, and the well layer may include a material such as GaN or AlInN.

The light emitting layer 33 may have a structure in which semiconductor materials having large band gap energy and semiconductor materials having small band gap energy are alternately stacked, and may include other Group III to V semiconductor materials according to the wavelength band of the emitted light. The light emitted by the light emitting layer 33 is not limited to light of a blue wavelength band, but the active layer 33 may also emit light of a red or green wavelength band in some cases.

The electrode layer 37 may be an ohmic connection electrode. However, the present disclosure is not limited thereto, and it may be a Schottky connection electrode. The light emitting element ED may include at least one electrode layer 37. The light emitting element ED may include one or more electrode layers 37, but the present disclosure is not limited thereto, and the electrode layer 37 may be omitted.

In the display device 10, when the light emitting element ED is electrically connected to an electrode or a connection electrode, the electrode layer 37 may reduce the resistance between the light emitting element ED and the electrode or connection electrode. The electrode layer 37 may include conductive metal. For example, the electrode layer 37 may include at least one of aluminum (Al), titanium (Ti), indium (In), gold (Au), silver (Ag), ITO, IZO, or ITZO.

The insulating layer 38 is arranged to surround the outer surfaces (e.g., outer peripheral or circumferential surfaces) of the plurality of semiconductor layers and electrode layers described above. For example, the insulating layer 38 may be disposed to surround at least the outer surface (e.g., the outer peripheral or circumferential surface) of the light emitting layer 33, and may be formed to expose both ends of the light emitting element ED in the longitudinal direction. Further, in cross-sectional view, the insulating layer 38 may have a top surface that is rounded in a region adjacent to at least one end of the light emitting element ED.

The insulating layer 38 may include a material having insulating properties, such as silicon oxide (SiOx), silicon nitride (SiNx), silicon oxynitride (SiOxNy), aluminum nitride (AlNx), and aluminum oxide (AlOx). It is illustrated in FIG. 14 that the insulating layer 38 is formed as a single layer, but the disclosure is not limited thereto. In some embodiments, the insulating layer 38 may be formed in a multilayer structure having a plurality of layers that are stacked therein.

The insulating layer 38 may function to protect the members. The insulating layer 38 may prevent an electrical short circuit that is likely to occur at the light emitting layer 33 when an electrode to which an electrical signal is transmitted is in direct contact with the light emitting element ED. In addition, the insulating layer 38 may prevent a decrease in light emission efficiency of the light emitting element ED.

Further, the insulating layer 38 may have an outer surface (e.g., an outer peripheral or circumferential surface) that is surface-treated. The light emitting elements ED may be aligned in such a way of spraying the ink in which the light emitting elements ED are dispersed on the electrodes. Here, the surface of the insulating layer 38 may be treated in a hydrophobic or hydrophilic manner in order to keep the light emitting elements ED in a dispersed state without aggregation with other light emitting elements ED adjacent in the ink.

FIG. 15 is a plan view illustrating a relative disposition of some of lower wires, a bank, and a plurality of electrodes disposed in one pixel of a display device according to one embodiment. FIG. 16 is a cross-sectional view taken along the line A1-A1 in FIG. 15. In FIG. 15, as some wires of the first conductive layer, the second conductive layer, and the third conductive layer, the electrodes RME of each of the sub-pixels SPXn are illustrated along with the scan lines SL1, SL2, and SL3 and the voltage wires VL1, VL2, and VL3. FIG. 16 illustrates a cross-section across the second light emitting element ED2 disposed in the first sub-pixel SPX1, the first scan line SL1, and the second scan line SL2.

Referring to FIGS. 15 and 16 in addition to FIGS. 6 and 7, the display device 10 may include the first to third sub-pixels SPX1, SPX2, and SPX3 in one pixel PX, and the scan lines SL1, SL2, and SL3, the data lines DTL, and the voltage wires VL1, VL2, and VL3 connected to each sub-pixel SPXn may be repeatedly disposed in units of an area occupied by one pixel PX. As the sub-pixels SPXn of each pixel PX are arranged along the second direction DR2, the wires extending in the first direction DR1 may be disposed in areas occupied by the sub-pixels SPXn different from each other according to the positions thereof. For example, the first scan line SL1 and the second scan line SL2 may be disposed in an area occupied by the first sub-pixel SPX1 or to the left side thereof, and the data lines DTL may be disposed on an area occupied by the second sub-pixel SPX2 and the third sub-pixel SPX3.

According to one embodiment, in the display device 10, the first scan line SL1 and the second scan line SL2 may be disposed adjacent to the electrodes RME of the first sub-pixel SPX1, but at least may be disposed so as not to overlap the first electrode RME1 in the thickness direction of the substrate SUB. Each of the first scan line SL1 and the second scan line SL2 may be disposed so as not to completely overlap the first electrode RME1. The first scan line SL1 and the second scan line SL2 may be disposed at a boundary between the first sub-pixel SPX1 and the third sub-pixel SPX3 of other pixel (e.g., a neighboring pixel) PX. Each of the first scan line SL1 and the second scan line SL2 may overlap a portion extending in the first direction DR1 of the bank BNL and the first protruding pattern BP1 in the thickness direction of the substrate SUB. Between the first scan line SL1 and the second scan line SL2, the second scan line SL2 adjacent to the first electrode RME1 may not overlap the first electrode RME1 in the thickness direction of the substrate SUB, but may partially overlap second electrode RME2. Depending on the disposition of the first scan line SL1 and the second scan line SL2, the first and second gate patterns GP1 and GP2 of the second conductive layer and the first and second conductive patterns DP1 and DP2 of the third conductive layer may also not-overlap the first electrode RME1 in the thickness direction of the substrate SUB.

A signal for light emission of the light emitting elements ED may be applied to the electrodes RME disposed in each sub-pixel SPXn, and signals for driving each sub-pixel SPXn may be applied to wires thereunder. When a signal is applied to the first and second scan lines SL1 and SL2 disposed under the via layer VIA, parasitic capacitance may be formed between the other conductive layer disposed above the first and second scan lines SL1 and SL2. In the display device 10 according to one embodiment, the scan lines SL1 and SL2 disposed under the via layer VIA may be disposed so as not to overlap the first electrode RME1 disposed on the via layer VIA in the thickness direction of the substrate SUB, so that it is possible to prevent the formation of parasitic capacitance in the first electrode RME1 by a signal applied to the scan lines SL1 and SL2. The display device 10 may reduce or minimize an influence of a wire under the via layer VIA on a signal applied to the electrode RME to which signal for light emission of the light emitting element ED is applied.

A signal for turning on the second transistor T2 and the third transistor T3 may be applied to the first scan line SL1 and the second scan line SL2, and a signal for light emission of the light emitting element ED may be applied to the first electrode RME1. Although a signal is applied to the first scan line SL1 and the second scan line SL2 while a signal for light emission of the light emitting element ED is applied to the first electrode RME1, a signal applied to the scan lines SL1 and SL2 may not affect the first electrode RME1 as the first electrode RME1 is disposed so as not to overlap the scan lines SL1 and SL2 in the thickness direction of the substrate SUB.

On the other hand, the first voltage wire VL1 and the third conductive pattern DP3 disposed on the right side of the second scan line SL2 may overlap the first electrode RME1 in the thickness direction of the substrate SUB. Because the first voltage wire VL1 is electrically connected to the first electrode RME1, substantially the same signal may be applied thereto, and there is no issue although the first voltage wire VL1 and the third conductive pattern DP3 overlap the first electrodes RME1 in the thickness direction.

In the display device 10, because a plurality of wires are repeatedly disposed per area occupied by one pixel PX, the types of wires disposed thereunder may be different for each sub-pixel SPXn. Although being disposed in the area occupied by the first sub-pixel SPX1, the scan lines SL1 and SL2 are disposed so as not to overlap the first electrode RME1, and thus a signal that is applied to the first electrode RME1 for each sub-pixel SPXn may not be affected by the lower wire. Accordingly, although the wire disposition is different for each sub-pixel SPXn, the intensity of light emitted from the light emitting element ED of the sub-pixels SPXn may be uniform, and there is an advantage in that luminance non-uniformity of the pixels PX due to a difference in light emission amount between the sub-pixels SPXn may be reduced.

In some embodiments, in the second sub-pixel SPX2, portions of the third gate pattern GP3, the initialization voltage wire VIL, and the capacitance electrodes CSE1 and CSE2 may be disposed under the plurality of electrodes RME. In the third sub-pixel SPX3, the plurality of data lines DTL and the second voltage wires VL2 may be disposed under the plurality of electrodes RME. The first electrode RME1 of the third sub-pixel SPX3 may overlap the third data line DTL3 in the thickness direction of the substrate SUB.

As described above, the first scan line SL1 and the second scan line SL2 are connected to at least one third scan line SL3. Accordingly, the pixels PX may be distinguished into the pixels PX different from each other according to the disposition of the ninth contact hole CNT9 to which the first and second scan lines SL1 and SL2 and the third scan line SL3 are connected. Whether the $r^{th}$ contact hole CNTr is formed may affect the formation of parasitic capacitance between the first and second scan lines SL1 and SL2 of the pixel PX and the first electrode RME1 of the first sub-pixel SPX1. That is, the structure of the pixel PX of the display device 10 may be designed to have a structure in which the first electrode RME1 of the first sub-pixel SPX1 selectively non-overlaps the first and second scan lines SL1 and SL2 thereunder, which is different from the second sub-pixel SPX2 and the third sub-pixel SPX3, due to the connection relationship between the scan lines SL1, SL2, and SL3.

FIG. 17 is a schematic view illustrating a relative disposition of a plurality of wires disposed on a plurality of pixels of a display device according to one embodiment. FIG. 17 illustrates the disposition of the scan lines SL1, SL2, and SL3, the voltage wires VL1, VL2, and VL3, and the third conductive pattern DP3 of the first conductive layer and the third conductive layer, and the position of the ninth contact hole CNT9.

Referring to FIG. 17 in addition to FIGS. 3, 15, and 16, the display device 10 may include the plurality of pixels PX arranged along the first direction DR1 and the second direction DR2, and the pixels PX may be arranged in a plurality of pixel rows PXR and pixel columns PXC. FIG. 17 illustrates first to fourth pixel columns PXC1, PXC2, PXC3, and PXC4 and first to fourth pixel rows PXR1, PXR2, PXR3, and PXR4.

The first scan line SL1, the second scan line SL2, the first voltage wire VL1, and the second voltage wire VL2 may extend in the first direction DR1 and may be disposed in the pixels PX belonging to the same pixel column PXC. The first scan line SL1, the second scan line SL2, the first voltage wire VL1, and the second voltage wire VL2 may be disposed with different wires for each different pixel column PXC.

The third scan line SL3 and the third voltage wire VL3 may extend in the second direction DR2 and may be disposed in the pixels PX belonging to the same pixel row PXR. The third scan line SL3 and the third voltage wire VL3 may be disposed with different wires for each different pixel row PXR.

The third scan line SL3 disposed in the first pixel row PXR1 may be connected to the second scan line SL2 through the ninth contact hole CNT9 in the second pixel column PXC2 and the fourth pixel column PXC4. The corresponding third scan line SL3 may not be connected to the first scan line SL1 and the second scan line SL2 disposed in the other pixel PX belonging to the same row, but may be connected to the second scan line SL2 in the two pixels PX.

The third scan line SL3 disposed in the second pixel row PXR2 may be connected to the first scan line SL1 through the ninth contact hole CNT9 in the second pixel column PXC2 and the fourth pixel column PXC4. The third scan line SL3 disposed in the third pixel row PXR3 may be connected to the second scan line SL2 in the first pixel column PXC1 and the third pixel column PXC3, and the third scan line SL3 disposed in the fourth pixel row PXR4 may be connected to the first scan line SL1 in the first pixel column PXC1 and the third pixel column PXC3.

One third scan line SL3 may be connected to the first scan line SL1 or the second scan line SL2 in one pixel among respective pixels disposed in a first pixel group PXG #1 and a second pixel group PXG #2. That is, one third scan line SL3 may be connected to the first scan line SL1 or the second scan line SL2 only in one pixel PX in any one pixel group PXG, and may not be connected thereto in the other pixel PX. The pixels PX belonging to the same row may be divided into a pixel in which the ninth contact hole CNT9 is formed and a pixel not formed with the hole. In the display device 10, the plurality of pixels PX may be divided into one or more pixel groups PXG according to a position of the display area DPA, and a pixel in which the ninth contact hole CNT9 is formed among the pixels belonging to the same row in one pixel group PXG may be one. Alternatively, the number of pixels in which the ninth contact hole CNT9 is formed among the pixels belonging to the same row may be the same as the number of pixel groups PXG distinguished in the display area DPA. For example, when the display device 10 is divided into the three pixel groups PXG according to the position of the display area DPA, the number of pixels PX in which the ninth contact hole CNT9 is formed among the pixels PX belonging to the same row may be three.

A pixel PX #12 disposed in the first pixel row PXR1—the second pixel column PXC2, and the pixel PX #14 disposed in the first pixel row PXR1—the fourth pixel column PXC4 may be a first type pixel PX1 in which the ninth contact hole CNT9 is formed. Similarly, a pixel PX #22 disposed in the second pixel row PXR2—the second pixel column PXC2, a pixel PX #24 disposed in the second pixel row PXR2—the fourth pixel column PXC4, a pixel PX #31 disposed in the third pixel row PXR3—the first pixel column PXC1, a pixel PX #33 disposed in the third pixel row PXR3—the third pixel column PXC3, a pixel PX #41 disposed in the fourth pixel row PXR4—the first pixel column PXC1, and a pixel PX #43 disposed in the fourth pixel row PXR4—the third pixel column PXC3 may each be the first type pixel PX1. Other pixels PX may each be a second type pixel in which the ninth contact hole CNT9 is not formed.

As described above, in the display device 10, the first type pixel PX1 and the second type pixel may be distinguished according to whether the third scan line SL3 and the first and second scan lines SL1 and SL2 are connected. In different types of pixels, the amount of light emission of the pixel PX may be changed by the parasitic capacitance that may be formed in the first electrode RME1 of the first sub-pixel SPX1, and luminance non-uniformity in the display area DPA may occur according to the disposition of the ninth contact hole CNT9. However, because the display device 10 according to one embodiment has a structure in which the first electrode RME1 of the first sub-pixel SPX1 is prevented from forming parasitic capacitance due to the first and second scan lines SL1 and SL2, the occurrence of the above-described luminance non-uniformity may be reduced or minimized.

In some embodiments, similarly to the third scan line SL3, whether the third voltage wire VL3 is connected to the first voltage wire VL1 and the second voltage wire VL2 may also vary depending on the pixel PX. In the pixels PX belonging to the first pixel row PXR1 and the third pixel row PXR3, a third voltage wire VL3 #1 may be integrated with the third conductive pattern DP3 to be connected to the first voltage wire VL1. On the other hand, in the pixels PX belonging to the second pixel row PXR2 and the fourth pixel row PXR4, a third voltage wire VL3 #2 may be spaced from the third conductive pattern DP3 and may be connected to the second voltage wire VL2.

The third voltage wire VL3 may be disposed on the lower side of the pixel PX to cross the sub-regions SA positioned on the lower side of the emission area EMA in the second direction DR2. The second electrode RME2 of each sub-pixel SPXn may overlap the third voltage wire VL3 in the sub-region SA positioned on the lower side of the emission area EMA, and may be connected to the third voltage wire VL3 through the second electrode contact hole CTS in the overlapping portion (see, for example, FIG. 10). However, the second electrode RME2 may be electrically connected to the second voltage wire VL2 and may not be connected to the third voltage wire VL3 #1 connected to the first voltage wire VL1. When the third voltage wire VL3 #1 connected to the first voltage wire VL1 is disposed in the corresponding pixel PX, the second electrode contact hole CTS may be omitted.

FIG. 18 is a schematic view illustrating a relative disposition of a plurality of wires, a bank, electrodes of neighboring pixels of a display device according to one embodiment. FIG. 19 is a cross-sectional view taken along the lines A2-A2' and A3-A3' of FIG. 18. FIG. 18 illustrates a relative disposition of the voltage wires VL1, VL2, and VL3, the electrodes RME, and the bank BNL in one pixels PX of the first pixel row PXR1 and the second pixel row PXR2, and FIG. 19 illustrates a cross-section across the electrodes RME in the sub-region SA positioned on the lower side of the emission area EMA.

Referring to FIGS. 18 and 19 in addition to FIG. 17, because the third voltage wire VL3 #1 disposed in the first pixel row PXR1 is integrated with the third conductive pattern DP3 to be connected to the first voltage wire VL1, the first power voltage applied to the first electrode RME1 may flow. Because the second electrode RME2 is not connected to the corresponding third voltage wire VL3 #1, the second electrode contact hole CTS may not be formed in the sub-pixels SPXn disposed in the first pixel row PXR1.

On the other hand, because the third voltage wire VL3 #2 disposed in the second pixel row PXR2 is spaced from the third conductive pattern DP3 and is connected to the second voltage wire VL2, the second power voltage applied to the second electrode RME2 may flow. Because the second electrode RME2 is connected to the corresponding third voltage wire VL3 #2, the second electrode contact hole CTS may be formed in the sub-pixels SPXn disposed in the second pixel row PXR2.

Unlike the first electrode RME1 and the third electrode RME3, the second electrode RME2 is not spaced from the second electrode RME2 of the other sub-pixel SPXn adjacent in the first direction DR1 in the sub-region SA, and thus the sub-pixels SPXn adjacent in the first direction DR1 may share one second electrode RME2. Accordingly, although the second electrode contact hole CTS is not formed in the pixel PX belonging to the first pixel row PXR1, the second power voltage applied to the second electrode RME2 of the pixel PX belonging to the second pixel row PXR2 may also flow to the first pixel row PXR1.

In some embodiments, the above-described display device 10 has a structure in which the first and second scan lines SL1 and SL2 and the first electrode RME1 of the first sub-pixel SPX1 do not overlap each other in the thickness direction, as a structure for preventing formation of parasitic capacitance between the first and second scan lines SL1 and SL2 and the first electrode RME1 of the first sub-pixel SPX1. However, the structure for preventing the formation of the parasitic capacitance may also be possible for a case other than the non-overlapping structure between the first and second scan lines SL1 and SL2 and the first electrode RME1.

FIG. 20 is a layout view illustrating a disposition of some wires and electrodes disposed in one pixel among a plurality of wires of a display device according to another embodiment. FIG. 21 is a cross-sectional view taken along the line A4-A4' in FIG. 20.

Referring to FIGS. 20 and 21, in a display device 10_1 according to an embodiment, a second scan line SL2_1 may overlap a first electrode RME1_1 of the first sub-pixel SPX1 in the thickness direction of the substrate SUB, and a pattern of the other conductive layer shielding therebetween may be further disposed. The display device 10_1 may further include a shielding layer BEL overlapping the first electrode RME1_1 and a second electrode RME2_1 of the first sub-pixel SPX1 in the thickness direction. The shielding layer BEL may be formed of the third conductive layer, and may be disposed to cover a first scan line SL1_1 and the second scan line SL2_1 and to overlap the electrode RME1_1 and the second electrode RME2_1 in the third direction DR3. In the display device 10_1, because the shielding layer BEL is disposed on the first scan line SL1_1 and the second scan line SL2_1, the first conductive pattern DP1 and the second conductive pattern DP2 that overlap the first scan line SL1_1 and the second scan line SL2_1 may be omitted.

The embodiment of FIGS. 20 and 21, compared to the embodiment of FIG. 4, may have a structure in which electrodes RME_1, the bank BNL, the protruding patterns BP1 and BP2, and the like that are disposed on the via layer VIA are shifted in the second direction DR2 with respect to the positions where the first scan line SL1_1 and the second scan line SL2_1 are disposed. The first scan line SL1_1 and the second scan line SL2_1 may overlap the second electrode RME2_1 and the first electrode RME1_2 of the first sub-pixel SPX1 in the thickness direction of the substrate SUB, respectively. In addition to the first electrode RME1_1 and the second electrode RME2_1 of the first sub-pixel SPX1, the shielding layer BEL may also overlap the bank BNL disposed on the left side of the first sub-pixel SPX1.

According to one embodiment, the shielding layer BEL may be electrically connected to any one of the voltage wires VL1, VL2, and VL3 to form an equipotential with the corresponding voltage wire, and may prevent the formation of parasitic capacitance between the first electrode RME1_1 and the second scan line SL2_1 although a signal is applied to the second scan line SL2_1. When the shielding layer BEL is not connected to the other voltage wire, parasitic capacitance may be formed between the second scan line SL2_1 and the shielding layer BEL, and between the shielding layer BEL and the first electrode RME1_1. To prevent this, the shielding layer BEL may be electrically connected to a voltage wire, for example, the second voltage wire VL2.

As an example, the shielding layer BEL may be directly connected to the second voltage wire VL2 disposed in the other pixel PX adjacent in the second direction DR2. The shielding layer BEL may be disposed to overlap the bank BNL disposed on the left side of the first sub-pixel SPX1, and a second voltage wire VL2 may be disposed thereunder. As the layers disposed on the via layer VIA are shifted in the second direction DR2, the second voltage wire VL2 may be disposed below the left bank BNL of the first sub-pixel SPX1 or at the boundary of the pixel PX adjacent in the second direction DR2. The shielding layer BEL may overlap the second voltage wire VL2 in the thickness direction of the substrate SUB, and may be directly in contact with the second voltage wire VL2 through a fourteenth contact hole CNT14 penetrating the buffer layer BL, the first gate insulating layer GI, and the first interlayer insulating layer IL1. The shielding layer BEL may receive a second power voltage like the second voltage wire VL2, and may be disposed between the first electrode RME1_1 and the second scan line SL2_1 to prevent the formation of parasitic capacitance by a signal applied to the second scan line SL2_1.

In the pixels PX of the first pixel row PXR1 illustrated in the embodiment of FIG. 17, the third conductive pattern DP3 and the third voltage wire VL3 may be integrated, and the third voltage wire VL3 may be connected to the first voltage wire VL1. In this case, the shielding layer BEL may be spaced from the third voltage wire VL3 and the third conductive pattern DP3, and may be directly connected to the second voltage wire VL2 through the fourteenth contact hole CNT14.

However, the present disclosure is not limited thereto, and in the pixel PX in which the third voltage wire VL3 is connected to the second voltage wire VL2, the shielding layer BEL may be integrally formed with the third voltage wire VL3. In the pixels PX of the second pixel row PXR2 illustrated in the embodiment of FIG. 17, the third conductive pattern DP3 and the third voltage wire VL3 may be spaced from each other, and the third voltage wire VL3 may be connected to the second voltage wire VL2. In this case, the shielding layer BEL may be spaced from the third conductive pattern DP3 and integrated with the third voltage wire VL3 to be electrically connected to the second voltage wire VL2.

FIG. 22 is a cross-sectional view illustrating a portion of a display device according to an embodiment.

Referring to FIG. 22, a display device 10_2 according to an embodiment may further include a second interlayer insulating layer IL2 and a fourth conductive layer disposed between the third conductive layer and the via layer VIA, and a shielding layer BEL_2 may be formed of a fourth conductive layer. As described above, in the display device 10_2, more layers may be disposed under the via layer VIA. As in FIG. 22, the second interlayer insulating layer IL2 may be disposed on the third conductive layer, and the fourth conductive layer may be disposed on the second interlayer insulating layer IL2. The fourth conductive layer may include some of the wires that may be disposed as the third conductive layer.

According to one embodiment, the fourth conductive layer of the display device 10_2 may include a shielding layer BEL_2, and the shielding layer BEL_2 may be electrically connected to the second voltage wire VL2_2. Similar to the aforementioned description, the shielding layer BEL_2 may be directly connected to a second voltage wire VL2_2 of the first conductive layer through a contact hole penetrating the lower layers, or may be connected to the third voltage wire VL3 of the third conductive layer. In the described embodiment, because a layer such as the shielding layer BEL_2 is formed of a fourth conductive layer disposed on the third conductive layer, there is an advantage in that the disposition design of wires disposed on the third conductive layer is relatively free. In addition, as a structure for preventing a voltage drop of a first scan line SL1_2 and a second scan line SL2_2, a space may be secured in which a first conductive pattern DP1_2 and a second conductive pattern DP2_2 may be disposed in addition to a first gate pattern GP1_2 and a second gate pattern GP2_2.

In concluding the detailed description, those skilled in the art will appreciate that many variations and modifications can be made to the embodiments of the present disclosure without substantially departing from the principles of the present disclosure. Therefore, the embodiments of the present disclosure are used in a generic and descriptive sense only and not for purposes of limitation.

What is claimed is:

1. A display device comprising:
    a pixel comprising a plurality of sub-pixels, each of the sub-pixels comprising a first electrode extending in a first direction, a second electrode spaced from the first electrode in a second direction, and a plurality of light emitting elements on the first electrode and the second electrode;
    a plurality of first scan lines on the pixel and extending in the first direction; and
    a second scan line spaced from the first scan line in the second direction,
    wherein the second scan line partially overlaps the second electrode, and wherein the second scan line does not overlap the first electrode,
    wherein the plurality of sub-pixels comprises a first sub-pixel on which a portion of a first scan line from among the plurality of first scan lines is located, and a second sub-pixel adjacent to the first sub-pixel in the second direction, and
    wherein the first scan line does not overlap the first electrode at the first sub-pixel.

2. The display device of claim 1, further comprising a bank including portions extending in the first direction and the second direction to surround a region in which the light emitting elements are located,
    wherein the first scan line overlaps a portion of the bank extending in the first direction.

3. The display device of claim 1, further comprising:
    a first voltage wire spaced from the second scan line in the second direction and overlapping the first electrode;
    a second voltage wire spaced from the first voltage wire in the second direction; and
    a plurality of data lines located between the first voltage wire and the second voltage wire.

4. The display device of claim 3, wherein the pixel further comprises a third sub-pixel adjacent to the second sub-pixel in the second direction and comprising a first electrode, a second electrode, and light emitting elements,
    wherein the second voltage wire is located in the third sub-pixel, and
    wherein the plurality of data lines are located between the second sub-pixel and the third sub-pixel.

5. The display device of claim 1, further comprising:
    a first gate pattern on the first scan line and connected to the first scan line; and
    a second gate pattern on the second scan line and connected to the second scan line,
    wherein each of the first gate pattern and the second gate pattern does not overlap the first electrode.

6. The display device of claim 5, further comprising:
    a first conductive pattern on the first gate pattern and connected to the first scan line; and
    a second conductive pattern on the second gate pattern and connected to the second scan line,
    wherein each of the first conductive pattern and the second conductive pattern does not overlap the first electrode.

7. A display device comprising:
    a pixel comprising a plurality of sub-pixels, each of the sub-pixels comprising a first electrode extending in a first direction, a second electrode spaced from the first electrode in a second direction, and a plurality of light emitting elements on the first electrode and the second electrode; and
    a plurality of first scan lines on the pixel and extending in the first direction;
    a second scan line spaced from the first scan line in the second direction and overlapping the first electrode; and
    a shielding layer disposed on the second scan line and overlapping the first electrode and the second scan line,
    wherein the plurality of sub-pixels comprises a first sub-pixel on which a portion of a first scan line from among the plurality of first scan lines is located, and a second sub-pixel adjacent to the first sub-pixel in the second direction, and wherein the first scan line does not overlap the first electrode at the first sub-pixel.

8. The display device of claim 7, further comprising:
a first voltage wire spaced from the second scan line in the second direction and overlapping the first electrode; and
a second voltage wire spaced from the second scan line in the second direction with the first voltage wire interposed therebetween,
wherein the shielding layer overlaps the second voltage wire, the first scan line, and the second scan line, and is electrically connected to the second voltage wire.

9. The display device of claim 8, wherein the second voltage wire is electrically connected to the second electrode.

10. The display device of claim 8, further comprising:
a first gate pattern on the first scan line and connected to the first scan line; and
a second gate pattern on the second scan line and connected to the second scan line,
wherein the second gate pattern overlaps the first electrode, and
wherein the shielding layer overlaps the first gate pattern and the second gate pattern.

11. The display device of claim 1, further comprising a third scan line extending in the second direction and connected to the first scan line or the second scan line.

12. The display device of claim 11, wherein the third scan line is in contact with the first scan line or the second scan line through a contact hole at a portion crossing the first scan line or the second scan line, and
wherein the display device comprises a plurality of pixels including the pixel, the plurality of pixels comprising a first type pixel in which the contact hole is disposed, and a second type pixel in which the contact hole is not disposed.

13. The display device of claim 12, wherein at least one of the plurality of pixels arranged along the second direction on a same row is the first type pixel, and remaining pixels are the second type pixels.

14. A display device comprising:
a substrate;
a first conductive layer on the substrate and comprising a first scan line and a second scan line, and a first voltage wire and a second voltage wire;
a buffer layer on the first conductive layer;
a semiconductor layer including a plurality of first active layers on the buffer layer;
a first gate insulating layer on the semiconductor layer;
a second conductive layer comprising a first gate pattern and a second gate pattern located on the first gate insulating layer, the first gate pattern overlapping the first scan line, the second gate pattern overlapping the second scan line, and a first gate electrode overlapping the first active layer;
a first interlayer insulating layer on the second conductive layer;
a third conductive layer on the first interlayer insulating layer and comprising a first source electrode and a first drain electrode connected to the first active layer;
a via layer on the third conductive layer;
a first electrode on the via layer and electrically connected to the first voltage wire, and a second electrode spaced from the first electrode on the via layer and electrically connected to the second voltage wire; and
a light emitting element on the first electrode and the second electrode,
wherein the first electrode does not overlap the first scan line in a thickness direction of the display device.

15. The display device of claim 14, wherein the first electrode overlaps the first voltage wire in the thickness direction of the display device and does not overlap the second scan line in the thickness direction of the display device, and
the second electrode partially overlaps the second scan line.

16. The display device of claim 15, wherein the third conductive layer further comprises a conductive pattern directly connected to the first voltage wire and overlapping the first electrode in the thickness direction of the display device.

17. The display device of claim 14, wherein the first electrode overlaps the second scan line in the thickness direction of the display device,
wherein the second voltage wire is spaced from the second scan line in a second direction with the first scan line interposed therebetween, and
wherein the display device further comprises a shielding layer on the first interlayer insulating layer and overlapping the first scan line, the second scan line, and the first electrode in the thickness direction of the display device.

18. The display device of claim 17, wherein the shielding layer is directly connected to the second voltage wire through a contact hole penetrating the first interlayer insulating layer, the first gate insulating layer, and the buffer layer at a portion overlapping the second voltage wire.

19. The display device of claim 17, further comprising a second interlayer insulating layer on the third conductive layer,
wherein the shielding layer is on the second interlayer insulating layer.

* * * * *